(12) United States Patent
Hill

(10) Patent No.: US 7,019,843 B2
(45) Date of Patent: *Mar. 28, 2006

(54) METHOD AND APPARATUS FOR STAGE MIRROR MAPPING

(75) Inventor: Henry Allen Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 363 days.

This patent is subject to a terminal disclaimer.

(21) Appl. No.: 10/406,749

(22) Filed: Apr. 3, 2003

(65) Prior Publication Data

US 2003/0210404 A1    Nov. 13, 2003

Related U.S. Application Data

(63) Continuation-in-part of application No. 09/853,114, filed on May 10, 2001, now Pat. No. 6,710,884, and a continuation-in-part of application No. 10/217,531, filed on Aug. 13, 2002, now Pat. No. 6,700,665.

(60) Provisional application No. 60/371,172, filed on Apr. 9, 2002.

(51) Int. Cl.
    *G01B 11/02* (2006.01)
(52) U.S. Cl. .................................... 356/500
(58) Field of Classification Search ............... 356/486, 356/487, 493, 498, 500
    See application file for complete search history.

(56) References Cited

U.S. PATENT DOCUMENTS

| 5,114,234 A | 5/1992 | Otsuka et al. |
| 5,151,749 A | 9/1992 | Tanimoto et al. |
| 5,187,543 A | 2/1993 | Ebert |
| 5,363,196 A | 11/1994 | Cameron |
| 5,764,361 A | 6/1998 | Kato et al. |

(Continued)

FOREIGN PATENT DOCUMENTS

JP          10260009 A       9/1998

*Primary Examiner*—Stephone B. Allen
(74) *Attorney, Agent, or Firm*—Francis J. Caufield

(57) ABSTRACT

Interferometer systems are described that comprise optical assemblies to measure multiple degrees of freedom of a stage mirror and the topography of a reflecting surface of a stage mirror represented by datum lines and datum lines with corresponding local rotations of the reflecting surface of the stage mirror about the datum lines with high lateral spatial resolution. The interferometer systems measure slopes of datum lines and local rotations of the reflecting surface about the datum lines using single pass interferometric measurements of angular changes of directions of beams reflected by the reflecting surfaces. Two or more datum lines on a reflecting surface with concomitant measures of local rotations may be used to characterize topographic features, and these may be measured in situ in a lithography tool or measured off line either before installation or after removal from a lithography tool. Interferometer systems are also described that comprise optical assemblies to measure multiple degrees of freedom of two and three stage mirrors and the topography of reflecting surfaces of the stage mirrors. Scanning in only two orthogonal axes is required for determination of the topography of reflecting surfaces. The two and three stage mirrors are arranged such that they are typically orthogonal or plane parallel to other surfaces of the two and three stage mirrors although other angles may be present such as 45 degrees. The topography of reflecting surfaces may be measured for mirrors that are used in end use applications other than in lithography tools.

34 Claims, 19 Drawing Sheets

U.S. PATENT DOCUMENTS

| | | |
|---|---|---|
| 5,790,253 A | 8/1998 | Kamiya |
| 6,020,964 A | 2/2000 | Loopstra et al. |
| 6,134,007 A | 10/2000 | Naraki et al. |
| 6,700,665 B1 * | 3/2004 | Hill .............................. 356/500 |
| 6,710,884 B1 * | 3/2004 | Hill .............................. 356/498 |
| 2003/0090675 A1 | 5/2003 | Fukiwara |

* cited by examiner

METHOD AND APPARATUS FOR STAGE MIRROR MAPPING

CROSS REFERENCES TO RELATED APPLICATIONS

This application is a continuation-in-part of U.S. patent application Ser. No. 09/853,114 filed on May 10, 2001 now U.S. Pat. No. 6,710,884 with the title "IN-SITU MIRROR CHARACTERIZATION" in the name of Henry Allen Hill and a continuation-in-part of U.S. patent application Ser. No. 10/217,531 filed on Aug. 13, 2002 now U.S. Pat. No. 6,700,665 with the title "IN-SITU MIRROR CHARACTERIZATION" in the name of Henry Allen Hill and claims the benefit of priority from U.S. Provisional Patent Application No. 60/371,172 filed on Apr. 9, 2002 with the title "METHOD AND APPARATUS FOR STAGE MIRROR MAPPING" in the name of Henry Allen Hill.

BACKGROUND OF THE INVENTION

This invention in general relates to interferometry and in particular to interferometric apparatus and methods by which the local surface characteristics of photolithographic stage mirrors or the like may be interferometrically measured in situ or off stage to provide correction signals for enhanced distance measurement accuracy.

Interferometry is a well established metrology used extensively in microfabrication processes to measure and control a host of critical dimensions. It is especially important in manufacturing semiconductors and the like where requirements for precision are 10 to 40% of critical dimensions of 0.1 μm or less.

Integrated circuits made of semiconductor materials are constructed by successively depositing and patterning layers of different materials on a silicon wafer while it typically resides in a flat exposure plane having Cartesian x-y coordinates to which there is a normal z-direction. The patterning process consists of a combination of exposure and development of photoresist followed by etching and doping of the underlying layers followed by the deposition of subsequent layers. This process results in a complex and, on the scale of microns, very non-homogeneous material structure on the wafer surface.

Typically, each wafer contains multiple copies of the same pattern called "fields" arrayed on the wafer in a nominally rectilinear distribution known as the "grid." Often, but not always, each field corresponds to a single "chip."

The exposure process consists of projecting the image of the next layer pattern onto (and into) the photoresist that has been spun onto the wafer. For an integrated circuit to function properly, each successive projected image must be accurately matched to the patterns already on the wafer. The process of determining the position, orientation, and distortion of the patterns already on the wafer, and then placing them in the correct relation to the projected image, is termed "alignment." The actual outcome, i.e., how accurately each successive patterned layer is matched to the previous layers, is termed "overlay."

In general, the alignment process requires both translational and rotational positioning of the wafer and/or the projected image as well as some distortion of the image to match the actual shape of the patterns already present. The fact that the wafer and the image need to be positioned correctly to get one pattern on top of the other is obvious. Actual distortion of the image is often needed as well. Other effects, such as thermal and vibration, may require compensation as well.

The net consequence of all this is that the shape of the first-level pattern printed on the wafer is not ideal and all subsequent patterns must, to the extent possible, be adjusted to fit the overall shape of the first-level printed pattern. Different exposure tools have different capabilities to account for these effects, but, in general, the distortions or shape variations that can be accounted for include x and y magnification and skew. These distortions, when combined with translations and rotations, make up the complete set of transformations.

Since the problem is to successively match the projected image to the patterns already on the wafer, and not simply to position the wafer itself, the exposure tool must effectively be able to detect or infer the relative position, orientation, and distortion of both the wafer patterns themselves and the projected image.

It is difficult to directly sense circuit patterns themselves, and therefore, alignment is accomplished by adding fiducial marks or "alignment marks" to the circuit patterns. These alignment marks can be used to determine the reticle position, orientation, and distortion and/or the projected image position, orientation, and distortion. They can also be printed on the wafer along with the circuit pattern and hence can be used to determine the wafer pattern position, orientation, and distortion.

Alignment marks generally consist of one or more clear or opaque lines on the reticle, which then become "trenches" or "mesas" when printed on the wafer. But more complex structures such as gratings, which are simply periodic arrays of trenches and/or mesas, and checkerboard patterns are also used. Alignment marks are usually located either along the edges of "kerf" of each field or a few "master marks" are distributed across the wafer. Although alignment marks are necessary, they are not part of the chip circuitry and therefore, from the chip maker's point of view, they waste valuable wafer area or "real estate." This drives alignment marks to be as small as possible, and they are often less than a few hundred microns on a side.

Alignment sensors are incorporated into the exposure tool to "see" alignment marks. Generally, there are separate sensors for the wafer, the reticle, and/or the projected image itself. Depending on the overall alignment strategy, these sensors may be entirely separate systems or they may be effectively combined into a single sensor. For example, a sensor that can see the projected image directly would nominally be "blind" with respect to wafer marks and hence a separate wafer sensor is required. But a sensor that "looks" at the wafer through the reticle alignment marks themselves is essentially performing reticle and wafer alignment simultaneously and hence no separate reticle sensor is necessary. Note, that in this case, the positions of the alignment marks in the projected image are being inferred from the positions of the reticle alignment marks, and a careful calibration of reticle to image positions must have been performed before the alignment step.

Furthermore, as implied above, essentially all exposure tools use sensors that detect the wafer alignment marks optically. That is, the sensors project light at one or more wavelengths onto the wafer and detect the scattering/diffraction from the alignment marks as a function of position in the wafer plane. Many types of alignment sensors are in common use and their optical configurations cover the full spectrum from simple microscopes to heterodyne grating interferometers. Also, since different sensor configurations operate better or worse on given wafer types, most exposure tools carry more than one sensor configuration to allow for good overlay on the widest possible range of wafer types.

The overall job of an alignment sensor is to determine the position of each of a given subset of all the alignment marks on a wafer in a coordinate system fixed with respect to the exposure tool. These position data are then used in either of two generic ways termed "global" and "field-by-field" to perform alignment.

In global alignment, the marks in only a few fields are located by the alignment sensor(s), and the data are combined in a best-fit sense to determine the optimum alignment of all the fields on the wafer. In field-by-field alignment, the data collected from a single field are used to align only that field. Global alignment is usually both faster, because not all the fields on the wafer are located, and less sensitive to noise, because it combines all the data together to find a best overall fit. But, since the results of the best fit are used in a feed-forward or dead reckoning approach, it does rely on the overall optomechanical stability of the exposure tool.

Alignment is generally implemented as a two-step process; that is, a fine alignment step with an accuracy of tens of nanometers follows an initial coarse alignment step with an accuracy of micrometers, and alignment requires positioning the wafer in all six degrees of freedom: three translation and three rotation. But adjusting the wafer so that it lies in the projected image plane, i.e., leveling the wafer and focusing the projected image, which involves one translational degree of freedom (motion along the optic axis, the z-axis or a parallel normal to the x-y wafer orientation) and two rotational degrees of freedom (orienting the plane of the wafer to be parallel to the projected image plane), is generally considered separate from alignment.

Only in-plane translation (two degrees of freedom) and rotation about the projection optic axis (one degree of freedom) are commonly meant when referring to alignment. The reason for this separation in nomenclature is the difference in accuracy required. The accuracy required for in-plane translation and rotation generally needs to be on the order of several tens of nanometers to on the order of nanometers or about 20 to 30% of the minimum feature size or critical dimension (CD) to be printed on the wafer. Current state-of-the-art CD values are on the order of 100 nm, and thus, the required alignment accuracy is significantly less than 100 nm. On the other hand, the accuracy required for out-of-plane translation and rotation is related to the total usable depth of focus of the exposure tool, which is generally closer to the CD value. Thus, out-of-plane focusing and leveling the wafer require less accuracy than in-plane alignment. Also, the sensors for focusing and leveling are usually completely separate from the "alignment sensors", and focusing and leveling do not usually rely on patterns on the wafer. Only the wafer surface or its surrogate needs to be sensed. Nevertheless, this is still a substantial task requiring, among other things, precise knowledge about the vertical position (the altitude) of the optical projection system above the wafer.

To achieve alignment, it is known to use plane mirror interferometers, passive zero shear interferometers, and interferometers having an active beam steering element, i.e., active zero shear interferometers. In active and passive zero shear interferometers, the precision of distance measurements is enhanced through the use of beam conditioning to assure that beams carrying distance information are appropriately aligned to provide optimal signal. With respect to the passive zero shear interferometers, a plane mirror measurement object is used as an element in the beam conditioner. For such interferometers, see, for example, U.S. Provisional Patent Application Nos. 60/314,345 entitled "Passive Zero Shear Interferometers Using Angle Sensitive Beam-Splitters" filed on Aug. 23, 2001, now U.S. patent application Ser. No. 10/207,314 entitled "Passive Zero Shear Interferometers" filed on Jul. 29, 2002; 60/314,568 entitled "Zero Shear Plane Mirror Interferometer" filed on Aug. 23, 2001, now U.S. patent application Ser. No. 10/227,167 entitled "Multiple-Pass Interferometry" filed on Aug. 23, 2002; and 60/314,569 entitled "Zero Shear Non-Plane Mirror Interferometer" filed on Aug. 23, 2001, now U.S. patent application Ser. No. 10/227,166 entitled "Optical Interferometry" filed on Aug. 23, 2002;; and 60/352,425 entitled "Reduced Differential Beam Shear Multiple-Degrees Of Freedom Interferometers" filed on Jan. 28, 2002, now U.S. patent application Ser. No. 10/352,616 entitled "Multiple-Pass Interferometry" filed on Jan. 28, 2003.

In active zero shear interferometers, dynamic elements are used in the beam conditioner wherein the angular orientation of the dynamic element is controlled via feedback and/or feed forward arrangements to assure that beams carrying distance information are appropriately aligned to provide optimal signal. Such interferometers are shown, for example, in commonly owned International Application No. PCT/US00/12097 filed May 5, 2000 and entitled "Interferometry Systems Having a Dynamic Beam-Steering Assembly For Measuring Angle and Distance" and published on Nov. 19, 2000 as WO 00/66969 and in commonly owned U.S. Provisional Applications 60/314,570 filed Aug. 23, 2001 and entitled "Dynamic Interferometer Controlling Direction Of Input Beam", now U.S. patent application Ser. No. 10/226,591 filed on Aug. 23, 2001 and published on Mar. 6, 2003 as US-2003-0043384 and 60/356,393 filed Feb. 12, 2002 and entitled "Interferometer With Dynamic Beam Steering Element Redirecting Input Measurement Beam Component And Output Reference Beam Component", now U.S. patent application Ser. No. 10/364,666 filed on Feb. 11, 2003 and entitled "Interferometer With Dynamic Beam Steering Element", wherein all three applications are in the name of Henry A. Hill.

However, even with passive zero shear and active zero shear interferometers, the shape of various reflecting elements impacts on the achievable precision in distance and angle measurements as stage mirrors undergo their various motions. The shape of the various reflecting elements impacts on the achievable precision because slope changes of reflecting elements in optical paths influence optical path lengths and beam directions. Typically, the shape of such reflecting elements, such as thin high aspect ratio mirrors, is characterized off-stage and the reflecting elements are then mounted on-stage. However, this is often unacceptable because precision of off-stage characterization is not sufficient, and/or the mounting process itself distorts the shape of the element compared with its inspected shape, and this change in shape can introduce measurement errors.

Accordingly, it is an object of the present invention to provide interferometric apparatus and methods by which maps of the surface topography of on-stage reflecting elements, such as thin high aspect ratio mirrors, may be measured in situ as well as off-stage with high spatial resolution to develop correction signals or check precision of correction signals that compensate for errors in both optical path lengths and beam directions related to shapes of reflecting surfaces wherein the interferometric apparatus may comprise integral optical assemblies.

It is another object of the present invention to provide interferometric apparatus and methods by which maps of the surface topography of on-stage reflecting elements, such as thin high aspect ratio mirrors, may be measured in situ as well as off-stage with high spatial resolution to develop correction signals or check precision of correction signals that compensate for errors in both optical path lengths and beam directions related to shapes of reflecting surfaces wherein only scanning in one or two orthogonal axes is required wherein the interferometric apparatus may comprise integral optical assemblies.

It is another object of the present invention to provide interferometric apparatus and methods by which maps of the surface topography of on-stage reflecting elements, such as thin high aspect ratio mirrors, may be measured in situ as well as off-stage with high spatial resolution to develop correction signals or check precision of correction signals that compensate for errors in both optical path lengths and beam directions related to shapes of reflecting surfaces arranged in orthogonal planes wherein the interferometric apparatus may comprise integral optical assemblies.

It is another object of the present invention to provide interferometric apparatus and methods by which maps of the surface topography of on-stage reflecting elements, such as thin high aspect ratio mirrors, may be measured in situ as well as off-stage with high spatial resolution to develop correction signals or check precision of correction signals that compensate for errors in both optical path lengths and beam directions related to shapes of reflecting surfaces arranged in orthogonal planes wherein only scanning in one or two orthogonal axes is required and wherein the interferometric apparatus may comprise integral optical assemblies.

It is yet another object of the present invention to exploit information generated from the operating properties of plane mirror interferometers, passive zero shear interferometers, and active zero shear interferometers by which the shapes of on-stage reflecting elements, such as thin high aspect ratio mirrors, may be measured in situ as well as off-stage to develop a high spatial resolution map of the reflecting surfaces represented by datum lines that can be subsequently used to generate correction signals for compensation of errors in both optical path lengths and beam directions related to shapes of the reflecting surfaces wherein the interferometers may comprise integral optical assemblies.

It is yet another object of the present invention to exploit information generated from the operating properties of plane mirror interferometers, passive zero shear interferometers, and active zero shear interferometers by which the shapes of on-stage reflecting elements, such as thin high aspect ratio mirrors, may be measured in situ as well as off-stage to develop a high spatial resolution map of the reflecting surfaces represented by datum lines that can be subsequently used to generate correction signals for compensation of errors in both optical path lengths and beam directions related to shapes of the reflecting surfaces wherein only scanning in one or two orthogonal axes is required and wherein the interferometers may comprise integral optical assemblies.

It is yet another object of the present invention to exploit information generated from the operating properties of plane mirror interferometers, passive zero shear interferometers, and active zero shear interferometers by which the shapes of on-stage reflecting elements, such as thin high aspect ratio mirrors, may be measured in situ as well as off-stage to develop high spatial resolution maps of the reflecting surfaces comprising datum lines on the surfaces of the reflecting surfaces and local rotations of the surfaces about the datum lines that can be subsequently used to generate correction signals for compensation of errors in both optical path lengths and beam directions related to shapes of the reflecting surfaces wherein the interferometers may comprise integral optical assemblies.

It is yet another object of the present invention to exploit information generated from the operating properties of plane mirror interferometers, passive zero shear interferometers, and active zero shear interferometers by which the shapes of on-stage reflecting elements, such as thin high aspect ratio mirrors, may be measured in situ as well as off-stage to develop high spatial resolution maps of the reflecting surfaces comprising datum lines on the surfaces of the reflecting surfaces and local rotations of the surfaces about the datum lines that can be subsequently used to generate correction signals for compensation of errors in both optical path lengths and beam directions related to shapes of the reflecting surfaces wherein only scanning in one or two orthogonal axes is required and wherein the interferometers may comprise integral optical assemblies.

It is yet another object of the present invention to provide interferometric apparatus and methods by which the shapes of off-stage reflecting elements, such as thin high aspect ratio mirrors, may be measured in situ as well as off-stage to develop with high spatial resolution correction signals that compensate for errors in both optical path lengths and beam directions related to shapes of reflecting surfaces wherein the interferometric apparatus may comprise integral optical assemblies.

It is yet another object of the present invention to provide interferometric apparatus and methods by which the shapes of off-stage reflecting elements, such as thin high aspect ratio mirrors, may be measured in situ as well as off stage to develop with high spatial resolution correction signals that compensate for errors in both optical path lengths and beam directions related to shapes of reflecting surfaces wherein only scanning in one or two orthogonal axes is required.

Other objects of the present invention will, in part, be obvious and will, in part, appear hereinafter when reading the following detailed description in conjunction with the drawings.

SUMMARY OF THE INVENTION

Interferometer systems that comprise optical assemblies to measure multiple degrees of freedom of a stage mirror and the topography of a reflecting surface of a stage mirror with high spatial resolution along one or more datum lines with corresponding local rotations of the reflecting surface of the stage mirror about the datum lines as needed in accordance with requirements. The interferometer systems measure local slopes of datum lines in planes having surface normals orthogonal to the scan direction, and local rotations of the reflecting surface about the datum lines, using single pass interferometric measurements of angular changes of directions of beams reflected by the reflecting surfaces. The interferometer systems are configured so that the multiple degrees of freedom are determined from combinations of measured linear and angular displacements of the surface. The topography of a reflecting surface represented by the datum lines and local rotations of the reflecting surface about the datum lines may comprise a set of two or more datum lines on the reflecting surface with concomitant measures of local rotations. The datum lines and concomitant local rotations may be measured in situ in a lithography tool or measured off line either before installation or after removal from a lithography tool. Interferometer systems are also described that comprise optical assemblies to measure multiple degrees of freedom of two and three stage mirrors and the topography of reflecting surfaces of the stage mirrors represented by datum lines and local rotations of the reflecting surfaces of the stage mirrors about the datum lines. Scanning in only two orthogonal axes is required for determination of the topography of reflecting surfaces of the stage mirrors represented by datum lines and local rotations of the reflecting surfaces of the stage mirrors about the datum lines. The two and three stage mirrors are arranged such that reflecting surfaces of the two and three stage mirrors are typically orthogonal or plane parallel to other surfaces of the two and three stage mirrors although other angles may be present, such as 45 degrees. The topography of reflecting surfaces may be measured for mirrors that are used in end use applications other than in lithography tools.

Methods are also described by which the topography of one or more of an array of preferably orthogonally arranged mirror surfaces may be characterized in situ.

In one aspect, the interferometric apparatus of the invention comprises a translation stage; an electromechanical arrangement for selectively translating the translation stage in at least one of at least two orthogonal directions; at least one thin, elongated mirror with a reflecting surface mounted in a predetermined manner with respect to the translation stage; interferometer means for generating a plurality of measurement beams adapted and arranged for projection onto the reflecting surface to measure the displacement of the translation stage in at least one direction and at least a local slope of the at least one thin, elongated mirror; control means having a mode of operation for selectively translating the translation stage, the at least one thin, elongated mirror and the interferometer means relative to one another in the mode of operation so that selected ones of the plurality of beams of the interferometer means scan the at least one thin, elongated mirror along at least one corresponding datum line extending along the longitudinal dimension thereof to generate at least one signal comprising information indicative of the local slope of the reflecting surface along the at least one corresponding datum line in at least one plane having a surface normal orthogonal to the direction of scan; and signal and analysis means for extracting the information contained in the at least one signal and determining the local shape of the at least one thin, elongated mirror.

In another aspect, the at least one signal further includes information indicative of the position of the reflecting surface in said at least one plane as a function of scan position along said at least one datum line.

BRIEF DESCRIPTION OF THE DRAWINGS

The structure, operation, and methodology of the invention, together with other objects and advantages thereof, may best be understood by reading the detailed description in connection with the drawings in which each part has an assigned numeral that identifies it wherever it appears in the various drawings, and wherein:

FIG. 2b diagrammatically shows an angular displacement interferometer used in the embodiment of FIG. 2a;

DETAILED DESCRIPTION

Figure 1:
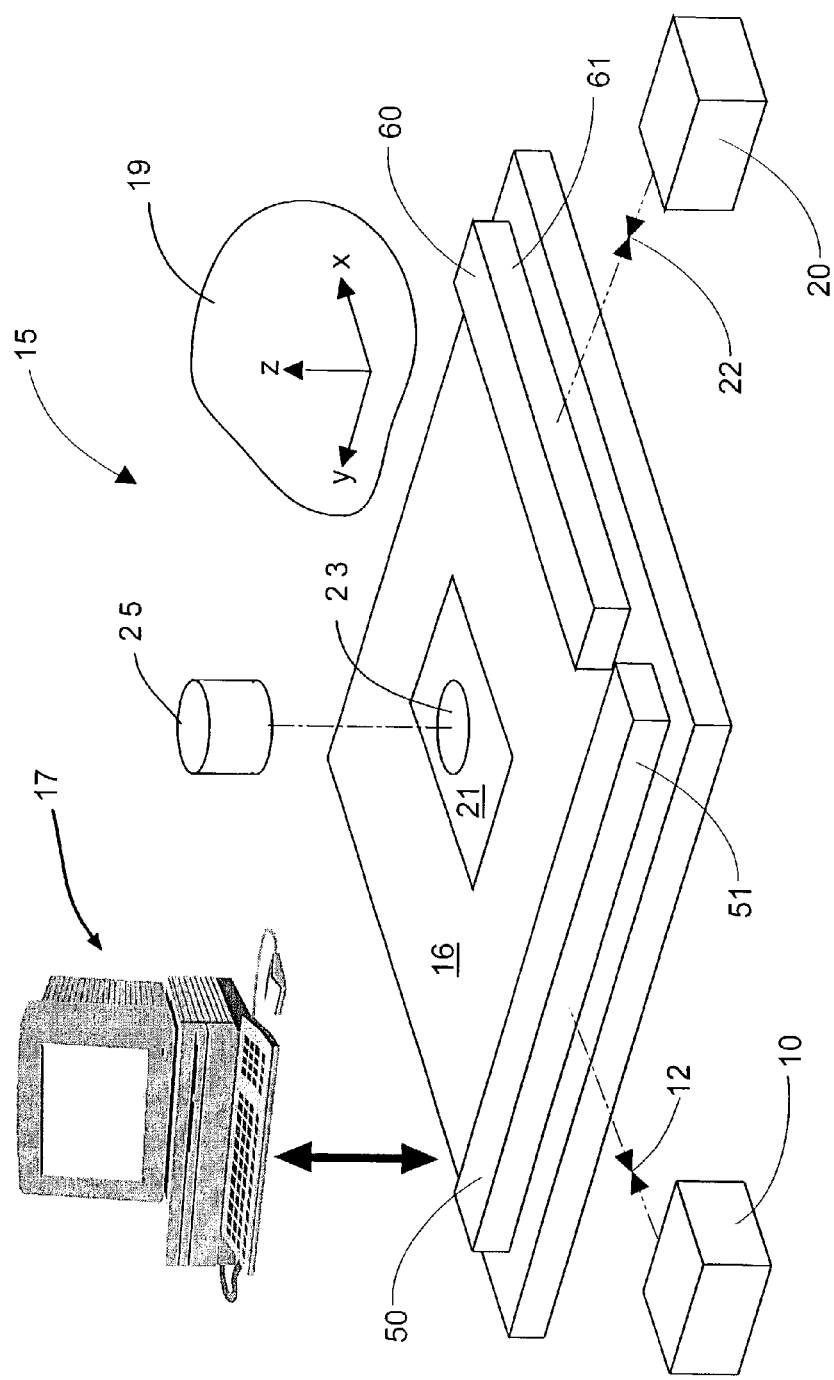
FIG. 1 is a diagrammatic perspective view of an interferometric system that employs a pair of orthogonally arranged interferometers or interferometer subsystems by which the shape of on-stage mounted elongated object mirrors may be characterized in situ with high spatial resolution along one or more datum lines.

A number of embodiments of the present invention are described herein, and these embodiments fall into several groups according to the type of information acquired about reflecting surfaces. A first group of the embodiments determine a datum line in one reflecting surface or a datum line in each of two reflecting surfaces with high spatial resolution wherein the two reflecting surfaces are substantially orthogonal to each other. A second group of the embodiments determine a pair of datum lines in one reflecting surface or a pair of datum lines in each of two reflecting surfaces with high spatial resolution wherein the two reflecting surfaces are substantially orthogonal to each other. A third group of the embodiments determine a pair of datum lines on a reflecting surface and concomitant local rotations of the reflecting surface about the datum lines or a pair of datum lines and concomitant local rotations in each of two reflecting surfaces with high spatial resolution wherein the two reflecting surfaces are substantially orthogonal to each other. A fourth group of the embodiments determine a combination of datum lines and concomitant local rotations in three reflecting surfaces with high spatial resolution wherein the three reflecting surfaces are substantially orthogonal to each other. The fourth group of the embodiments may have a measurement beam incident on a reflecting surface with an angle of incidence of the order of 45 degrees. Five different types of interferometers are used to measure linear and angular displacements of respective reflecting surfaces in the various embodiments and variants thereof.

The precision of interferometrically measured changes in displacements of objects comprising reflecting surfaces is generally affected by unaccounted departures of the reflecting surfaces from planes and from scanning and/or shearing of measurement beams across the reflective surfaces. The unaccounted departures arise from unaccounted local displacements of the reflecting surfaces and local changes in overall orientation of the reflecting surfaces. It is for this reason that certain of the embodiments of the present invention are configured to measure properties of datum lines in a reflecting surface and rotations of the reflecting surfaces about the datum lines.

A measured change in relative phase of components of an output beam of an interferometer is generally represented as one or more terms of the form $kL\cos^2\chi$ where $k$ is a wavenumber corresponding to the wavelength of an input beam to the interferometer, $L$ is a physical length such as a distance from the interferometer to the measurement object, and $\chi$ is an angle that a component of a measurement beam makes with a measurement axis of the interferometer. For the case where the orientation of a stage is substantially not changed about an axis orthogonal to the measurement axis of an interferometer, the precision to which changes in an associated $\chi$ need be known is significantly relaxed, and only the precision of the change in relative phase is of concern. However, when there are large systematic changes in $\chi$, e.g., 500 microradians due to changes in pitch and yaw of a stage, effects of departures of the reflecting surfaces from plane surfaces can be important. Consider, for example, an application where a stage position need be known to a precision of 0.1 nm, such as may be required in an EUV lithography tool. For a high stability plane mirror interferometer (HSPMI) having a value of $L=1$ m and $\chi=500$ microradians, the precision to which $\chi$ needs to be known is $\leq 50$ nanoradians.

Reference is now made to FIG. 1, which is a diagrammatic perspective view of an interferometric system 15 that employs a pair of orthogonally arranged interferometers or interferometer subsystems by which the shape of on-stage mounted elongated object mirrors may be characterized in situ with high spatial resolution along one or more datum lines. As shown in FIG. 1, system 15 comprises a stage 16 that preferably forms part of a photolithographic apparatus for fabricating semiconductor products such as integrated circuits or chips. The stage 16 moves within a well-known reference frame generally designated at 19 and is provided with a mount 21 for holding photolithographic wafers 23 to be exposed by a photolithographic exposure unit 25. Affixed to stage 16 is a thin, high aspect ratio plane mirror 50 having a y-z reflective surface 51 elongated in the y-direction.

Also, fixedly mounted to stage 16 is another thin, high aspect ratio plane mirror 60 having an x-z reflective surface 61 elongated in the x-direction. Mirrors 50 and 60 are mounted on stage 16 so that their reflective surfaces, 51 and 61, respectively, are nominally orthogonal to one another. Stage 16 is otherwise mounted in a well-known manner for nominally plane translation but may experience small angular rotations about the x, y, and z axes due to bearing and drive mechanism tolerances. In normal operation, system 15 is adapted to be operated for scanning in the y-direction for a set value of x.

Fixedly mounted off-stage is an interferometer (or interferometer subsystem) that is generally indicated at 10. The purpose of interferometer 10 generally is to measure the position in the x-direction and angular rotation of stage 16 about the y and/or z axes as stage 16 translates in the y-direction, and thus the position in the x-direction and angular rotation of reflecting surface 51 about the y and/or z axes as stage 16 translates in the y-direction. To accomplish this, interferometer 10 may be structured and arranged as one of a number of interferometric types including, but not limited to, a plane mirror interferometer; a passive zero shear interferometer; or an active zero shear interferometer. With each type, as will be described in more detail hereinafter as separate embodiments, interferometric beams travel to and from mirror 50 generally along an optical path designated as 12.

Another interferometer or interferometer subsystem 20, preferably one of the same type as that of interferometer 10, is fixedly mounted off-stage to measure the position in the y-direction and angular rotation of stage 16 about the x and/or z axes as stage 16 translates in the y-direction. To achieve this, interferometer 20 directs and receives interferometric beams to and from mirror surface 61 along an optical path designated generally as 22. Control, data processing, and housekeeping functions are preferably provided by a general purpose computer, such as that designated at 17, programmed in a well-known manner to perform data processing and exchange signals and data between it and system 15 via an interface shown diagrammatically by the two way bold arrow.

Figure 2A:
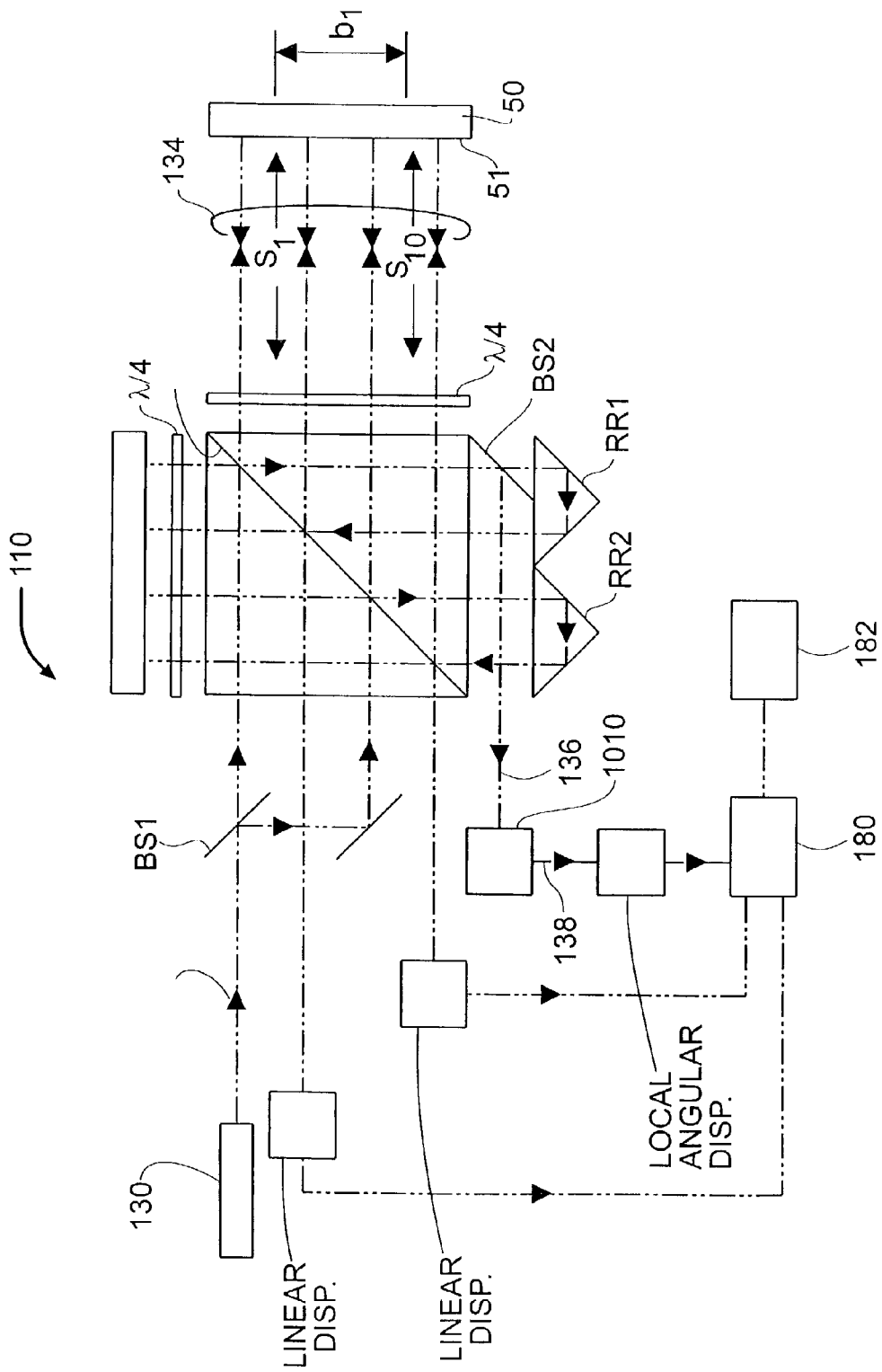
FIG. 2a is a diagrammatic plan view of a first embodiment of the interferometers of FIG. 1 in the form of a plane mirror type.

Reference is now made to FIG. 2a wherein a first embodiment of interferometers 10 and 20 is shown in the form of a plane mirror type indicated generally as 110 and configured such that the shape of on-stage mounted elongated object mirrors 50 and/or 60 represented by a datum line for each of mirrors 50 and/or 60 may be characterized in situ. Interferometer 110 is structured and arranged in a manner to measure changes in an average slope and in a local slope of a reflective surface in the x-y plane. The average slope is defined as the difference in distance in a direction, such as the x-direction, to two separated positions on the reflecting surface in the x-y plane divided by the lateral separation of the two positions.

Interferometer 110 comprises two high stability plane mirror interferometers (HSPMIs) and an angular displacement interferometer as shown schematically in FIG. 2a as an integral optical assembly. Interferometer 110 will be described for operation as interferometer 10; it being understood that interferometer 20 operates in an analogous manner. Beam 134 comprises the measurement beams of the two HSPMIs that contact reflecting surface 51. The path of beam 134 corresponds to the path indicated by numeral 12 in FIG. 1. The two HSPMIs measure changes in displacements $x_1$ and $x_{10}$ of reflecting surface 51 along corresponding measurement axes. Displacements $s_1$ and $s_{10}$ in FIG. 2a correspond to displacements $x_1$ and $x_{10}$, respectively. Measured values of displacements $x_1$ and $x_{10}$ are used to determine the displacement of reflecting surface 51 along a subsystem measurement axis and to determine the average change in orientation of reflecting surface 51 associated with two points on reflecting surface 51 separated by distance $b_1$.

The change in a local slope of reflective surface 51 in a x-y plane is determined by measuring the change in direction of a beam that has been reflected once by reflecting surface 51. For this purpose, a portion of the reference/measurement beam of the $x_1$ measuring HSPMI is reflected by beam-splitter BS2 as beam 136. The measurement beam component of beam 136 has made a single pass to reflecting surface 51.

Changes in direction of propagation of beam 136 are measured by angular displacement interferometer 1010. Angular displacement interferometer 1010 is shown schematically in FIG. 2b. The description of angular displacement interferometer 1010 is the same as the description given for an angle interferometer in commonly owned U.S. Provisional Patent Application 60/351,496 filed Jan. 24, 2002 and entitled "Interferometers For Measuring Changes In Optical Beam Direction" by Henry A. Hill, now included in U.S. patent application Ser. No. 10/271,034 filed on Oct. 15, 2002, the contents of which are included herein in their entirety by way of reference. Other forms of angular displacement interferometers that may be incorporated into the first embodiment without departing from the scope and spirit of the present invention to measure interferometrically the change in direction of a beam are described in commonly owned U.S. Pat. No. 6,271,923 issued on Aug. 7, 2001; U.S. Pending patent application Ser. Nos. 09/852,369 filed on May 10, 2001 and published on Jan. 3, 2002 as Publication No. US-2002-0001087, Ser. No. 09/599,348 filed on Jun. 20, 2000, and U.S. Provisional Patent Application Nos. 60/201,457 filed on May 3, 2000, now U.S. patent application Ser. No. 09/842,556 filed on Apr. 26, 2001 and published on Mar. 21, 2002 as Publication Number US-2002-0033951-A1, the contents of the cited commonly owned applications and patent(s) are herein incorporated in their entirety by reference.

Other forms of double pass plane mirror configurations such as described in commonly owned U.S. Provisional Patent Application 60/356,394 filed Feb. 12, 2002 and entitled "Separated Beam Multiple Degree Of Freedom Interferometers" by Henry A. Hill, now U.S. patent application Ser. No. 10/364,300 filed on Feb. 11, 2003 and described in an article entitled "Differential interferometer arrangements for distance and angle measurements: Principles, advantages and applications" by C. Zanoni, *VDI Berichte Nr.* 749, 93–106 (1989) may be incorporated in the first embodiment without departing from the scope and spirit of the present invention. The contents of the cited U.S. Provisional Patent Application 60/356,394 and the article by Zanoni are incorporated herein in their entirety by reference.

Input beam 132 comprises two orthogonally polarized components that have different frequencies. Source 130 of input beam 132, such as a laser, can be any of a variety of frequency modulation apparatus and/or lasers. The two frequency components of input beam 132 can be generated in source 130, for example, by laser Zeeman splitting, by acousto-optical modulation, or internal to the laser using birefringent elements, or the like. The reference and measurement beam components of beam 132 are polarized orthogonal and parallel to the plane of FIG. 2a, respectively.

While system 15 is normally operated to measure y translation, it is operated in a special mirror characterization mode to measure the shape of mirror surface 51 in situ along a datum line in the x-y plane thereof. In the mirror characterization mode, stage 16 is translated in the y-direction so that the measurement beam of interferometer 10 scans the mirror surface 51 along a datum line and generates signals containing information indicative of its angular orientation and surface departure in the x-y plane from a plane in the x-direction, along with any contributions due to variations in the translation mechanism for moving stage 16, cyclic non-linearities, and stationary and non-stationary effects of a gas in measurement paths of beams of interferometers 10 and 20. The orientation of stage 16 is preferably selected for the special mirror characterization mode such that there is nominally zero shear of the measurement beam components of the output beams of the two HSPMIs and the output beam of the angular displacement interferometer 1010.

Simultaneous with translation of stage 16 in the y-direction, interferometer 20 monitors orientation of mirror 61 for a fixed intercept point of the measurement beam of interferometer 20 with reflecting surface 61. This step permits measurement of the rotation of stage 16 due to mechanical contributions of its translation mechanism, such as bearings, drive mechanisms, and the like. With this information, two signals are generated. The first signal is from interferometer 10 which contains information about the change in combined angular orientation of stage 16 and the local slope along a datum line and the change in combined angular orientation of stage 16 and the average slope of reflecting surface 51 along the datum line and the second signal is from interferometer 20 which contains information about the angular orientation of stage 16 as a function of displacement in the y-direction.

Information about a local slope on the reflecting surface 61 is not used in determining properties of the datum line in reflecting surface 51 because the position of stage 16 is not changing in the x-direction during the scan in the y-direction.

The first and second signals are combined to extract information about the average slope and the local slope of mirror surface 51 along its datum line, i.e., <dx/dy> and $(dx/dy)_{local}$, respectively, by electronic processor 180 and computer 182. <dx/dy> and $(dx/dy)_{local}$ are then processed by electronic processor 180 and computer 182 using integral transforms of <dx/dy> and $(dx/dy)_{local}$ to obtain the x displacement $X_1(y)$ of the datum line in the x-y plane as a function of y. An integral transform of <dx/dy> furnishes information about the spatial frequency spectrum of $X_1(y)$ with reduced sensitivity for spatial frequencies $\cong 1/b_1$ and harmonics thereof of the datum line and the integral transform of $(dx/dy)_{local}$ furnishes information about spatial frequencies of $X_1(y)$ that cannot be determined from an integral transform of <dx/dy>. The datum line represents departures of the surface of reflecting surface 51 in the x-y plane from a straight line but does not represent the orientation of the straight line in the x-y plane.

An algorithm is given as an example of the processing by electronic processor 180 and computer 182 to obtain displacement $X_1(y)$. The algorithm is designed to yield a measured value $X_{M,1}(y)$ of $X_1(y)$ which has a minimum value for the variance of each Fourier spatial frequency component of $X_1(y)$. The information on the Fourier transform of $X_1(y)$, i.e., $F\{X_1(y)\}$, that is obtained from the Fourier transform of <dx/dy> and $(dx/dy)_{local}$ is $$F\{X_1(y)\} = -i\left[\frac{\exp\left[-i\frac{Kb_1}{2}\right]}{2\sin\left(\frac{Kb_1}{2}\right)}\right]F\{\langle dx/dy\rangle\}, \quad (1)$$

$$F\{X_1(y)\} = i\left(\frac{1}{K}\right)F\{(dx/dy)_{local}\}, \quad (2)$$

where K is $2\pi$ times the spatial frequency. The effects of the finite size of the beams contacting reflecting surface 51 limit spatial frequency bandwidth to 1/d of information obtained about F{$X_1(y)$} where d is the diameter of the beams. The effects of the finite size of the beams may be easily incorporated into Equations (1) and (2) but have been omitted here so as to show in a simple fashion the important features of an algorithm without departing from the scope and spirit of the present invention. F{$X_1(y)$} is a function of K. It is evident from Equation (1) that the Fourier transform F{<dx/dy>} has reduced sensitivity with respect to spatial frequencies $\cong 1/b_1$ and harmonics thereof.

The variances of F{$X_1(y)$} obtained by Equations (1) and (2) are $\sigma_1^2$ and $\sigma_2^2$, respectively, and can be obtained for example by power spectral analyses of respective F{$X_1(y)$} given by Equations (1) and (2). The algorithm for the processing by electronic processor 180 and computer 182 to obtain F{$X_{M,1}(y)$} is expressed formally as $$F\{X_{M,1}(y)\} = i\left[\frac{1}{\sigma_1^2 K^2 + \sigma_2^2 4\sin^2\left(\frac{Kb_1}{2}\right)}\right] \times \left[\left[-\sigma_2^2 2\sin\left(\frac{Kb_1}{2}\right)\exp\left[i\left(\frac{Kb_1}{2}\right)\right]F\left\{\left\langle\frac{dx}{dy}\right\rangle\right\}+\sigma_1^2 KF\left\{\left(\frac{dx}{dy}\right)_{local}\right\}\right]\right]. \quad (3)$$

An inverse Fourier transform of F{$X_{M,1}(y)$} is next performed by electronic processor 180 and computer 182 to obtain $X_{M,1}(y)$.

The spatial frequency bandwidth of $X_{M,1}(y)$ is approximately 1/d due to the effects of the finite size of the beams contacting reflecting surface 51.

Effects of cyclic errors are compensated in the determination of the measured quantities <dx/dy> and $(dx/dy)_{local}$. The cyclic errors are compensated by modulating the position of stage 16 in the x- and y-directions during the scan in the y-direction and filtering the first and second signals to eliminate the effects of cyclic errors. The modulation of the stage position separates in frequency space the components of the first and second signals due to cyclic errors from primary components of the first and second signals representing the information about the shape of the reflecting surface 51 and rotation of stage 16. The primary signal components are subsequently isolated by spectral analyses, e.g., finite Fourier transforms, in electronic processor 180 and computer 182. The amplitude of the modulations in the x- and y-directions is small compared to the diameter of the measurement beams but large enough to permit adequate separation of the primary signal components and the signal components due to cyclic errors.

An example of a cyclic error compensation technique that may be incorporated into the first embodiment without departing from the scope and spirit of the present invention is described in commonly owned U.S. Provisional Application 60/337,478 filed Nov. 5, 2001 and entitled "Cyclic Error Compensation And Resolution Enhancement" by Henry A. Hill, now U.S. patent application Ser. No. 10/287,898 filed on Nov. 5, 2002, the contents of which are incorporated herein in their entirety by reference.

Another example of a cyclic error compensation technique that may be incorporated into the first embodiment without departing from the scope and spirit of the present invention is described in commonly owned U.S. Provisional Patent Application 60/303,299 filed Jul. 6, 2001 and entitled "Interferometry System And Method Employing An Angular Difference In Propagation Between Orthogonally Polarized Input Beam Components" by Henry A. Hill and Peter de Groot, now U.S. patent application Ser. No. 10/174,149 published on Jan. 9, 2003 as Publication No. US-2003-0007156-A1, the contents of which are incorporated herein in their entirety by reference.

Another example of a cyclic error compensation technique that may be incorporated into the first embodiment without departing from the scope and spirit of the present invention is described in commonly owned U.S. Application No. 60/314,490 filed Aug. 23, 2001 and entitled "Tilted Interferometer" by Henry A. Hill, now U.S. patent application Ser. No. 10/218,965 published on Feb. 27, 2003 as Publication No. US-2003-0038947, the contents of which are herein incorporated in their entirety by reference.

Other techniques for cyclic error compensation may be incorporated into the first embodiment without departing from the scope and spirit of the present invention such as described in commonly owned U.S. Pat. No. 6,137,574 entitled "Systems And Methods For Characterizing and Correcting Cyclic Errors In Distance Measuring And Dispersion Interferometry," U.S. Pat. No. 6,252,668 B1 entitled "Systems And Methods For Quantifying Non-Linearities In Interferometry Systems;" and U.S. Pat. No. 6,246,481 issued on Jun. 12, 2001 and entitled "Systems And Methods For Quantifying Nonlinearities In Interferometry Systems" wherein all three are by Henry A. Hill, the contents of the three above-cited patents and patent applications are herein incorporated in their entirety by reference.

Effects of stationary and non-stationary changes of a gas in the measurement paths 12 and 22 are compensated in the first embodiment for those end use applications where required. The techniques for compensation of the stationary and non-stationary effects are the same as described in commonly owned U.S. Provisional Patent Application Nos. 60/335,963 filed Nov. 15, 2001 and entitled "Compensation For Effects Of Stationary Non-Random Changes And Stationary Random Fluctuations In Refractivity Of Gas In Interferometers", now U.S. patent application Ser. No. 10/294,158 filed on Nov. 14, 2002 and 60/352,061 filed Jan. 24, 2002 and entitled "Non-Dispersive Method And Apparatus For Compensation Of Turbulence Effects Of Gas In Interferometry", now U.S. patent application Ser. No. 10/350,522 filed on Jan. 24, 2003, wherein both are by Henry A. Hill, the contents of both cited applications are incorporated herein in their entirety by reference.

Thus, by measuring the change in the direction of the measurement beam component of beam 136 of interferometer 10 in the x-y plane and the change in the difference $x_{10}-x_1$ and accounting for contributions to those changes brought about by changes in stage rotations, cyclic errors, and effects of gas in measurement paths, the shape of mirror surface 51 can be determined with high spatial resolution in the x-y plane along a datum line while it is mounted in its working environment.

An important feature of the present invention is the use of a single beam interferometer for measurement of a change in orientation of a surface wherein the measured change contains all spatial frequencies up to a cutoff frequency given by 1/d, where d is the diameter of the measurement beam in the single beam interferometer. The use of only two double pass interferometers, such as two HSPMIs, to measure a change in orientation of a surface would cause loss of all spectral components that have spatial frequencies with spatial wavelengths equal to the measurement axis spacing of the two double pass interferometers, corresponding for example to $b_1$ in FIG. 2a, and harmonics thereof, so that the full shape of a reflecting surface can not be recovered.

A corresponding datum line is next generated for reflecting surface 61 by scanning in the x direction and repeating the procedure described for the generation of the datum line in reflecting surface 51.

For an end use application wherein only information about a datum line in one reflecting surface, e.g., reflecting surface 51, is required, it will evident to those skilled in the art that the single pass angle interferometer in interferometer 20 can be omitted without departing from the scope and spirit of the present invention. It will also be evident to those skilled in the art that when only a single datum line need be measured, the second interferometer 20 can for example comprise another form of angle measuring interferometer such as the type shown and described in, for example, the cited article by Zanoni and of the type of angle measuring interferometers shown and described in U.S. patent application Ser. No. 09/842,556 filed on Apr. 26, 2001 and entitled "Dynamic Angle Measuring Interferometer" and published on Mar. 21, 2002 as Publication No. US-2002-0033951-A1.

An important feature of the first embodiment is that interferometers 10 and 20 can each be integral optical assemblies that contribute to increased stability of the interferometers with respect to precision of measurements and compactness of design.

An important advantage of the first embodiment is that the special mirror characterization mode of the first embodiment may be incorporated into the processing of wafers as part of an in-process wafer procedure that does not interfere with through put of a lithography tool. In particular, the first and second signals can be obtained when the condition for the special mirror characterization mode is satisfied during a set of in-process wafer procedures and subsequently used for determination of the shape of mirror surfaces 51 and 61 with high spatial resolution in a x-y plane along a datum line. The condition as previously stated is that the orientation of stage 16 for the special mirror characterization mode is such that there is nominally zero shear of the measurement beam components of the output beams of the two HSPMIs and the output beam of the angular displacement interferometer 1010. The condition need only be satisfied for a small subset of the time used in processing wafers to maintain an effective in-process mirror characterization. As a further consequence, the shape as represented by datum lines of the reflecting surfaces such as 51 and 61 may be monitored for changes with respect to time in situ without interfering with through put of a lithography tool.

The first embodiment comprises thin elongated high aspect ratio mirrors 50 and 60 affixed to stage 16 wherein each of the two mirrors 50 and 60 have single plane reflecting surfaces 51 and 61, respectively. Other forms of object mirrors may be incorporated in the first embodiment without departing from the scope and spirit of the present invention. An example of an other form is a thin elongated high aspect ratio Porro prism such as described in commonly owned U.S. Pat. No. 6,163,379 issued Dec. 19, 2000 and entitled "Interferometer With Tilted Waveplates For Reducing Ghost Reflections" by Peter de Groot, the contents of which are herein incorporated in their entirety by reference.

Figure 2B:
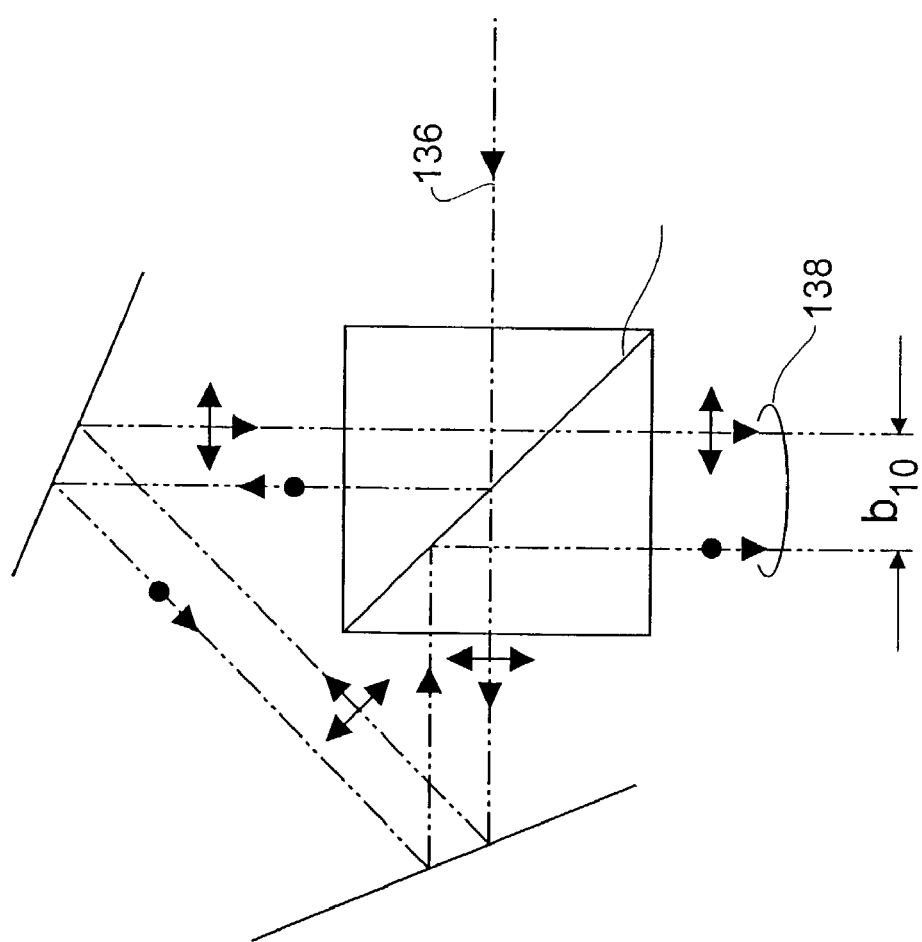
Figure 2C:
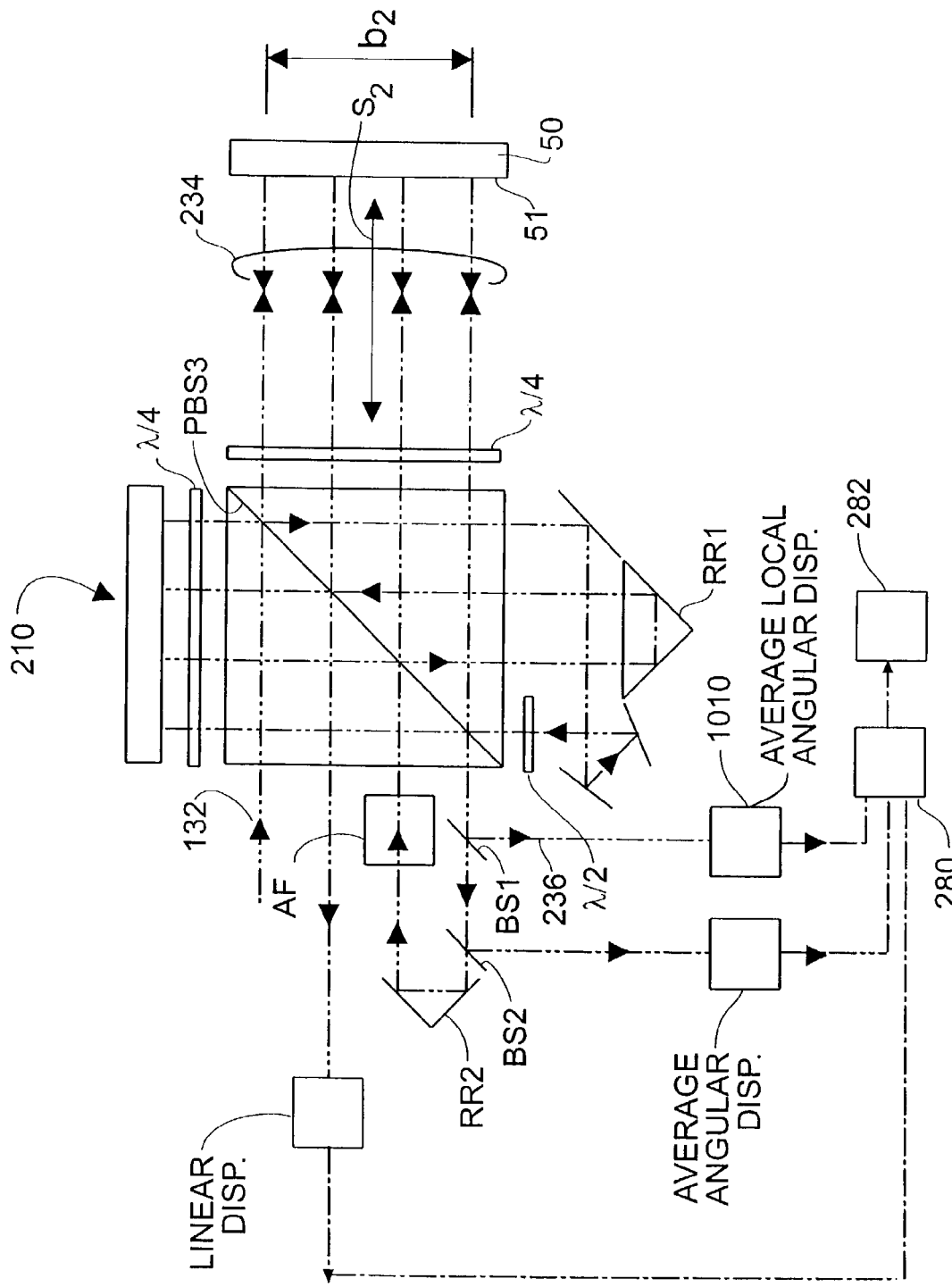
FIG. 2c is a diagrammatic plan view of a second embodiment of the interferometers of FIG. 1 and which are of a passive zero shear type, more specifically a zero differential shear type.

A second embodiment of interferometers 10 and 20 is of a passive zero shear type, more specifically a zero differential shear type, indicated generally as 210 in FIG. 2c and configured such that the shape of on-stage mounted elongated object mirrors 50 and 60, represented by a datum line for each of mirrors 50 and 60, may be characterized in situ with high spatial resolution. Interferometer 210 is structured and arranged in a manner to measure changes in an average slope and in an average local slope of a reflective surface in a x-y plane. The average slope is defined as the difference in distance in a direction, such as the x-direction, to two separated positions on the reflecting surface in the x-y plane divided by the lateral separation of the two positions. The average local slope is defined as the average of the local slopes measured in the x-y plane at the two separated positions.

Interferometer 210 comprises a HSPMI for measuring a linear displacement and a high stability plane mirror interferometer for measuring an average angular displacement of mirror 50 in an integral optical assembly. Interferometer 210 will be described for operation as interferometer 10, it being understood that interferometer 20 operates in an analogous manner. The input beam for the linear displacement interferometer is a portion of the output beam of the angular displacement interferometer expanded by a factor of 2 by an afocal lens system AF such that the direction of the measurement beam of the linear displacement interferometer is orthogonal to reflecting surface 51 independent of changes in orientation of mirror 50. When surface 51 changes orientation by an angle $\alpha$, the direction of a beam reflected by 51 changes by an angle $2\alpha$. When this reflected beam passes through an afocal system that expands the beam by a factor of 2, the change in direction of the transmitted beam is reduced from $2\alpha$ to $\alpha$. Therefore the angle between the transmitted beam and the reflecting surface 51 is a constant independent of orientation of 51 and thus can by designed to be 90 degrees. AF is for afocal. The output beam of the angular displacement interferometer has zero differential shear between the respective reference and measurement beam components. As a consequence, there is zero differential beam shear between the reference and measurement output beam components of the linear displacement interferometer, i.e. the input beam to the linear displacement interferometer has been conditioned to achieve the highly desirable zero differential beam shear condition wherein zero differential beam shear leads to reduced non-cyclic non-linear errors.

Beam 234 comprises the measurement beams of the linear and angular displacement interferometers that contact reflecting surface 51. The path of beam 234 corresponds to the path indicated by numeral 12 in FIG. 1. The linear and angular displacement interferometers measure changes in $x_2$ and $\theta_2$, respectively, of reflecting surface 51. Linear displacement $s_2$ in FIG. 2c corresponds to displacement $x_2$. Angle $\theta_2$ represents an average angular orientation of reflecting surface 51 in the x-y and in the plane of FIG. 2c. Measured values of displacements $x_2$ and $\theta_2$ are used to determine the displacement of reflecting surface 51 along a system measurement axis and to determine the average change in orientation of reflecting surface 51 associated with two points on reflecting surface 51 separated by distance $b_2$, respectively. $\theta_2$ is also equivalent to the average slope associated with the two points in the x-y plane.

The change in an average local slope of reflective surface 51 in the x-y plane is determined by measuring the change in direction of a beam wherein reference and measurement beam components of the beam have been reflected once by reflecting surface 51. For this purpose, a portion of the reference/measurement beam of the angular displacement interferometer is reflected by beam-splitter BS1 as beam 236. The reference and measurement beam components of beam 236 have each made a single pass to reflecting surface 51. The reference and measurement beam components of beam 236 have zero differential shear since the output beam of the angular displacement interferometer has as cited zero differential beam shear.

Changes in the average direction of propagation of components of beam 236 are measured by an angular displacement interferometer 1010 shown schematically in FIG. 2b. Beam 236 is incident on interferometer 1010 wherein the output beam contains information about the average direction of propagation of the reference and measurement beam components of beam 236 in the plane of FIG. 2c and consequently about the average of the local slopes of reflecting surface 51 at two positions separated in the x-direction by $b_2$. The information about the average slope and the average local slope is obtained by electronic processor 280 and computer 282 from the electrical interference signals generated by detectors in the average angular displacement interferometer and interferometer 1010.

While system 15 is normally operated to measure y translation, it is operated in a mirror characterization mode to measure the shape of mirror surface 51 in situ along a datum line in the x-y plane thereof. In the mirror characterization mode, stage 16 is translated in the y-direction so that measurement beam of interferometer 10 scans the mirror surface 51 along a datum line and generates signals containing information indicative of its angular orientation and surface departure in the x-y plane from a plane in the x-direction, along with any contributions due to variations in the translation mechanism for moving stage 16, cyclic non-linearities, and stationary and non-stationary effects of a gas in measurement paths of beams of interferometers 10 and 20.

Simultaneous with translation of stage 16 in the y-direction, interferometer 20 monitors orientation of mirror 61 for a fixed intercept point of the measurement beam of interferometer 20 with reflecting surface 61. This step permits measurement of the rotation of stage 16 due to mechanical contributions of its translation mechanism, such as bearings, drive mechanisms, and the like. With this information, two signals are generated. The first signal is from interferometer 10 which contains information about the change in combined angular orientation of stage 16 and the average local slope in the x-y plane of reflecting surface 51 and the change in combined angular orientation of stage 16 and average slope in the x-y plane of reflecting surface 51 along the datum line and the second signal is from interferometer 20 which contains information relevant to the angular orientation of stage 16 as a function of displacement in the y-direction.

Information about an average local slope and about an average slope on the reflecting surface 61 is not used in determining properties of the datum line in reflecting surface 51 because the position of stage 16 is not changing in the x-direction during the scan in the y-direction.

In electronic processor 280 and computer 282, the first and second signals are combined and information extracted about the average slope and the average local slope of mirror 51 in the x-y plane along its datum line, i.e., <dx/dy> and <(dx/dy)$_{local}$>, respectively. <dx/dy> and <(dx/dy)$_{local}$> are then processed by electronic processor 280 and computer 282 using integral transforms of <dx/dy> and <(dx/dy)$_{local}$> to obtain the x displacement $X_2(y)$ of the datum line in the x-y plane as a function of y. An integral transform of <dx/dy> furnishes information about the spatial frequency spectrum of $X_2(y)$ with reduced sensitivity for spatial frequencies $\cong 1/b_2$ and harmonics thereof of the datum line and the integral transform of <(dx/dy)$_{local}$> furnishes information about the spatial frequencies of $X_2(y)$ with reduced sensitivity for spatial frequencies $\cong 1/(2b_2)$ and odd harmonics thereof of the datum line. The datum line represents departures of the surface of reflecting surface 51 in the x-y plane from a straight line but does not represent the orientation of the straight line in the x-y plane.

An algorithm is given as an example of the processing by electronic processor 280 and computer 282 to obtain displacement $X_2(y)$. The algorithm is designed to yield a measured value $X_{M,2}(y)$ of $X_2(y)$ which has a minimum value for the variance of each Fourier spatial frequency component of $X_2(y)$. The information on the Fourier transform of $X_2(y)$, i.e., $F\{X_2(y)\}$, that is obtained from the Fourier transform of <dx/dy> and <(dx/dy)$_{local}$> is $$F\{X_2(y)\} = -i\left[\frac{\exp\left[-i\frac{Kb_2}{2}\right]}{2\sin\left(\frac{Kb_2}{2}\right)}\right]F\{\langle dx/dy\rangle\}, \quad (4)$$

$$F\{X_2(y)\} = i\left(\frac{1}{K}\right)\left[\frac{\exp\left[-i\frac{Kb_2}{2}\right]}{2\cos\left(\frac{Kb_2}{2}\right)}\right]F\{\langle (dx/dy)_{local}\rangle\}. \quad (5)$$

The effects of the finite size of the beams contacting reflecting surface 51 limit spatial frequency bandwidth to 1/d of information obtained about $F\{X_2(y)\}$ where d is the diameter of the beams. The effects of the finite size of the beams may be easily incorporated into Equations (4) and (5) but have been omitted here so as to show in a simple fashion the important features of an algorithm without departing from the scope and spirit of the present invention. It is evident from Equations (4) and (5) that the Fourier transform $F\{<dx/dy>\}$ has reduced sensitivity with respect to spatial frequencies $\cong 1/b_2$ and harmonics thereof and the Fourier transform of $F\{<(dx/dy)_{local}>\}$ has reduced sensitivity with respect to spatial frequencies $\cong 1/(2b_2)$ and odd harmonics thereof.

The variances of $F\{X_2(y)\}$ obtained by Equations (4) and (5) are $\sigma_3^2$ and $\sigma_4^2$, respectively, and can be obtained for example by power spectral analyses of respective $F\{X_2(y)\}$ given by Equations (4) and (5). The algorithm for the processing by electronic processor 280 and computer 282 to obtain $F\{X_{M,2}(y)\}$ is expressed formally as $$F\{X_{M,2}(y)\} = \frac{i}{2}\left[\frac{\exp\left[-i\left(\frac{Kb_2}{2}\right)\right]}{\sigma_4^2\sin^2\left(\frac{Kb_2}{2}\right)+\sigma_3^2K^2\cos^2\left(\frac{Kb_2}{2}\right)}\right]\times \quad (6)$$
$$\left[\left[-\sigma_4^2\sin\left(\frac{Kb_2}{2}\right)F\left\{\left\langle\frac{dx}{dy}\right\rangle\right\}+\sigma_3^2K\cos\left(\frac{Kb_2}{2}\right)F\left\{\left\langle\left(\frac{dx}{dy}\right)_{local}\right\rangle\right\}\right]\right].$$

An inverse Fourier transform of $F\{X_{M,2}(y)\}$ is next performed by electronic processor 280 and computer 282 to obtain $X_{M,2}(y)$.

The spatial frequency bandwidth of $X_{M,2}(y)$ is approximately 1/d due to the effects of the finite size of the beams contacting reflecting surface 51.

The zero differential beam shear property [differential beam shear refers to only beam shear of one beam with respect to another and zero differential beam shear means that both beams are sheared by the same amount in the same direction] of interferometer 210 that is the result of use of a single pass interferometer for measuring the average slope and for beam conditioning leads to reduced amplitudes of cyclic errors in electrical interference signals generated by each of the three interferometers of the second embodiment. The residual effects of cyclic errors are however compensated in the determination of measured quantities <dx/dy> and $<(dx/dy)_{local}>$ if required in an end use application of the second embodiment. The description of the techniques used for the compensation of the residual effects of cyclic errors is the same as the corresponding portions of the description given for the first embodiment.

Effects of stationary and non-stationary changes of a gas in the measurement paths 12 and 22 are compensated in the second embodiment for those end use applications where required. The description of the techniques used for the compensation of the effects of stationary and non-stationary changes of a gas in the measurement paths 12 and 22 is the same as the corresponding portions of the description given for the first embodiment.

A corresponding datum line is next generated for reflecting surface 61 by scanning in the x direction and repeating the procedure described for the generation of the datum line in reflecting surface 51.

An advantage of the second embodiment is that as a consequence of the zero differential shear feature of output beams of interferometers in the second embodiment, there is no restriction on the angular orientation of stage 16 such as encountered for the first embodiment of the present invention. In the first embodiment, stage 16 was preferably orientated so that there was nominally no beam shear of the measurement beam components of the output beams of the interferometers used for measuring changes in local slopes. This restriction is present in the first embodiment so as to obtain an optimal electrical interference signal with respect to amplitude from the angle interferometers used to measure local slopes.

Another advantage of the second embodiment is that as a further consequence of the zero differential shear feature and the no restriction on the angular orientation of stage 16, the mirror characterization mode of the second embodiment may be integrated into the processing of wafers as part of an in-process wafer procedure that does not interfere with through put of a lithography tool. As an additional consequence, the shape of the reflecting surfaces such as 51 and 61 may be monitored for changes with respect to time in situ without interfering with through put of a lithography tool.

Another advantage of the second embodiment is that the measured average slope and the measured average local slope contain information at higher spatial frequencies by a factor of 2 than does the measured changes in linear displacement by the HSPMI. This a consequence of the difference in beam diameters for the angular displacement interferometer and the HSPMI.

An important feature of the second embodiment is that interferometers 10 and 20 can each be integral optical assemblies that contributes to increased stability of the interferometers with respect to precision of measurements and compactness of design.

The remaining description of the second embodiment is the same as corresponding portions of the description given for the first embodiment of the present invention.

Figure 2D:
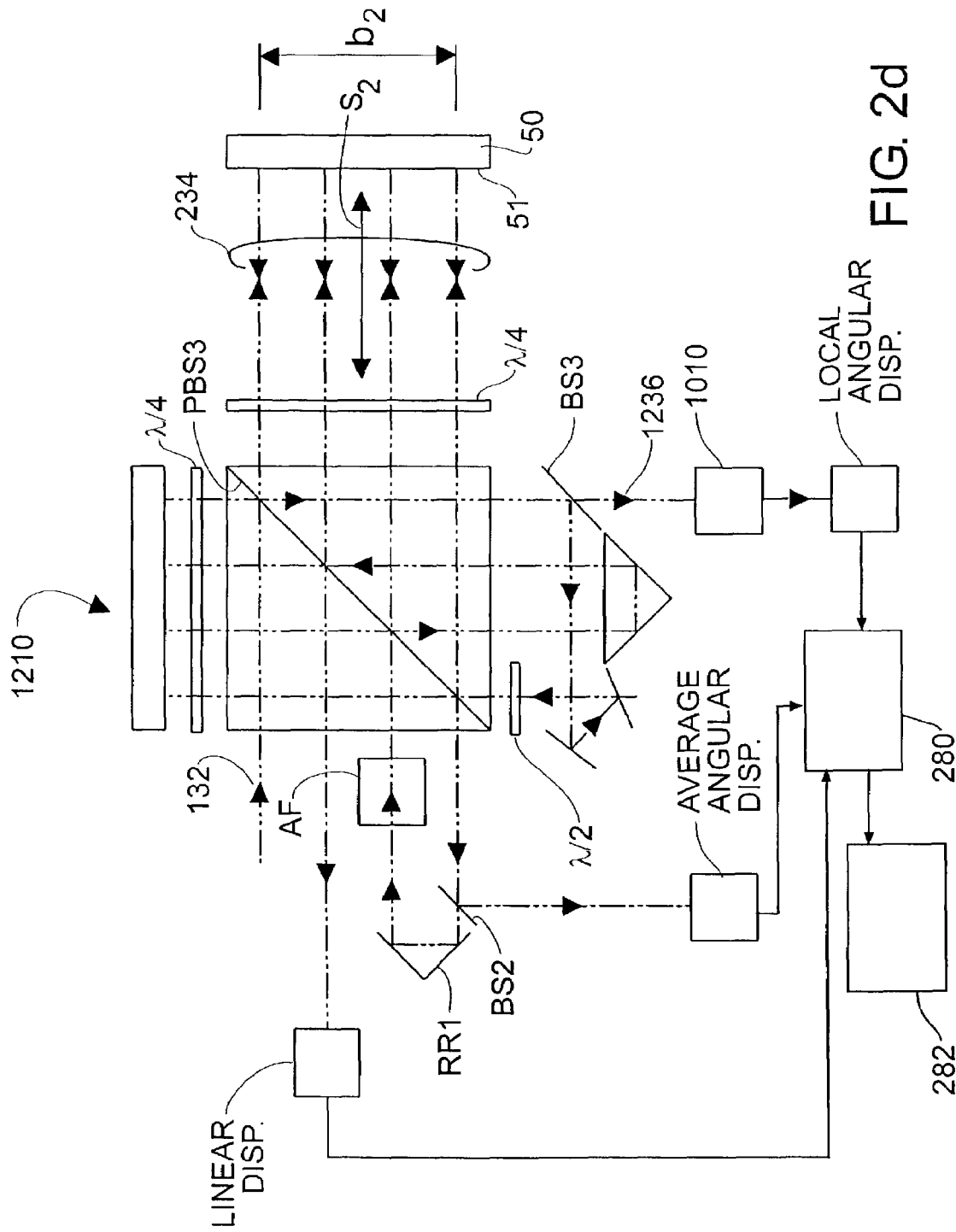
FIG. 2d is a diagrammatic plan view of a variant of the second embodiment of the interferometers of FIG. 1 and are of a passive zero shear type, more specifically a zero differential shear type.

A variant of second embodiment of interferometers 10 and 20 is of a passive zero shear type, more specifically a zero differential shear type, indicated generally as 1210 in FIG. 2d and configured such that the shape of on-stage mounted elongated object mirrors 50 and 60 represented by a datum line for each of mirrors 50 and 60 may be characterized in situ with high spatial resolution. The variant of the second embodiment differs from the second embodiment in the generation of information on local angular displacements. In the variant of the second embodiment, changes in local angular displacements are measured and in the second embodiment, changes in average local angular displacements are measured. As subsequently described, the special mirror characterization mode used in the variant of the second embodiment is the same as the special mirror characterization mode of the first embodiment.

Interferometers 10 and 20 of the variant of the second embodiment comprise many elements that have the same element numbers as elements of the second embodiment wherein the elements having the same element numbers perform like functions. The change in a local slope of reflective surface 51 in a x-y plane is determined by measuring the change in direction of a beam that has been reflected once by reflecting surface 51. For this purpose, a portion of the reference/measurement beam of the angular displacement interferometer is transmitted by beam-splitter BS3 as beam 1236. The measurement beam component of beam 1236 has made a single pass to reflecting surface 51.

Changes in direction of propagation of beam 1236 are measured by angular displacement interferometer 1010 as shown in FIG. 2d. Angular displacement interferometer 1010 is shown schematically in FIG. 2b.

While system 15 is normally operated to measure y translation, it is operated in a special mirror characterization mode to measure the shape of mirror surface 51 in situ along a datum line thereof. In the mirror characterization mode, stage 16 is translated in the y-direction so that measurement beam of interferometer 10 scans the mirror surface 51 along a datum line and generates signals containing information indicative of its angular orientation and surface departure in the x-y plane from a plane in the x-direction, along with any contributions due to variations in the translation mechanism for moving stage 16, cyclic non-linearities, and stationary and non-stationary effects of a gas in measurement paths of beams of interferometers 10 and 20.

The orientation of stage 16 is preferably selected for the special mirror characterization mode such that there is nominally zero shear of the measurement beam component of the input beam to angular displacement interferometer 1010.

The variant of the second embodiment measures changes in a local slope and changes in an average slope the same as the first embodiment of the present invention. As a consequence, the remaining description of the variant of the second embodiment is the same as the corresponding portions of the description given for the first embodiment.

An important advantage of the variant of the second embodiment is that the special mirror characterization mode of the variant of the second embodiment may be incorporated into the processing of wafers as part of an in-process wafer procedure that does not interfere with through put of a lithography tool. In particular, the first and second signals can be obtained when the condition for the special mirror characterization mode is satisfied during a subset of the time used in processing wafers and subsequently used for determination of the shape of mirror surfaces 51 and 61 with high spatial resolution in the x-y plane along datum lines. The condition as previously stated is that the orientation of stage 16 for the special mirror characterization mode is such that there is nominally zero shear of the measurement beam component of the input beam to the angular displacement interferometer 1010. The condition need only be satisfied for a small subset of the time used in processing wafers to maintain an effective in-process mirror characterization. As a further consequence, the shape as represented by datum lines of the reflecting surfaces, such as 51 and 61, may be monitored for changes with respect to time in situ without interfering with through put of a lithography tool.

An important feature of the variant of the second embodiment is that interferometers 10 and 20 can each be integral optical assemblies that contribute to increased stability of the interferometers with respect to precision of measurements and compactness of design.

Figure 2E:
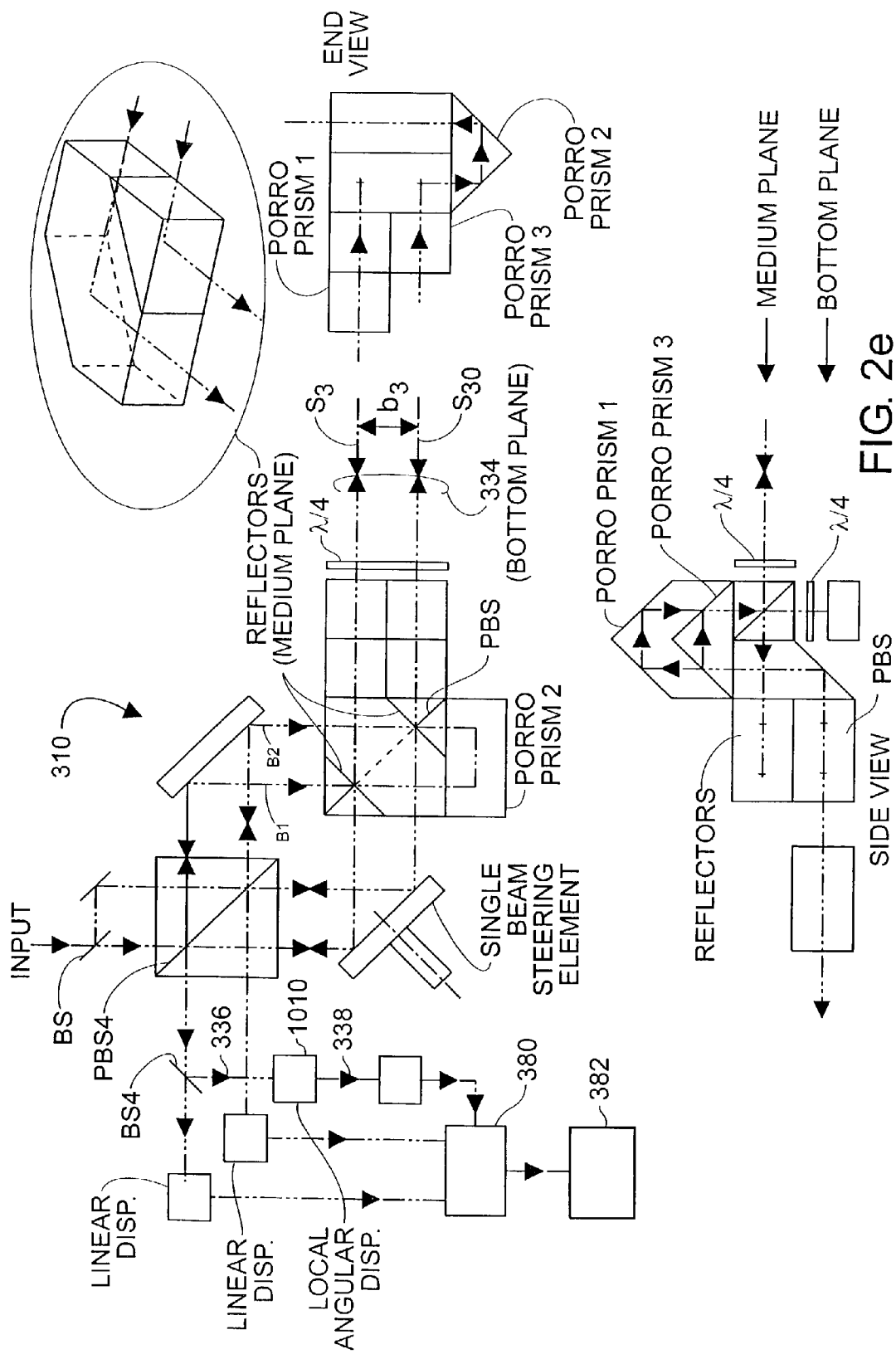
FIG. 2e is a diagrammatic plan view of a third embodiment of interferometers of FIG. 1 comprising interferometers of an active zero shear type.

A third embodiment of interferometers 10 and 20 comprises interferometers of an active zero shear type indicated generally as 310 in FIG. 2e and configured such that the shape of on-stage mounted elongated object mirrors 50 and 60 represented by a datum line for each of mirrors 50 and 60 may be characterized in situ with high spatial resolution. Interferometer 310 is structured and arranged in a manner to measure changes in an average slope and in a local slope of a reflective surface in a x-y plane. The average slope is defined as the difference in distance in a direction such as the x-direction to two separated positions on the reflecting surface in the x-y plane divided by the lateral separation of the two positions.

Interferometer 310 comprises two active zero shear plane mirror interferometers and will be described for operation as interferometer 10. The active zero shear interferometer used in the third embodiment is the same as the active zero shear interferometer described in aforementioned commonly owned U.S. Provisional Application 60/356,393 filed Feb. 12, 2002 and entitled "Interferometer With Dynamic Beam Steering Element Redirecting Input Measurement Beam Component And Output Reference Beam Component" by Henry A. Hill, now U.S. patent application Ser. No. 10/364,666 filed on Feb. 11, 2003, which is incorporated herein in its entirety by reference. As described in that application, beam steering mirrors are provided with beam steering capability that are used to maintain beams on paths that are normal to measurement object mirrors by way of feedback or feed forward signals. Here, information about the orientation of mirror 50 obtained by interferometer 10 is used in a feed forward mode. Other forms of active zero shear interferometers may be incorporated in the third embodiment without departing from the scope and spirit of the present invention such as described in PCT Patent Application filed May 5, 2000 and entitled "Interferometry Systems Having a Dynamic Beam-Steering Assembly For Measuring Angle and Distance" published on Nov. 19, 2000 as Publication No. WO 00/66969, U.S. Provisional Patent Application No. 60/201,457 filed on May 3, 2000 and entitled "Apparatus And Method(s) For Measuring And/Or Controlling Differential Paths Of Light Beams", now U.S. patent application Ser. No. 09/842,556 published on Mar. 21, 2002 as Publication No. US-2002-0033951, and in U.S. Provisional Application 60/314,570 filed Aug. 23, 2001 and entitled "Dynamic Interferometer Controlling Direction Of Input Beam,", now U.S. patent application Ser. No. 10/226,591 published on Mar. 6, 2003 as Publication No. US-2003-0043384, the three applications of which are in the name of Henry A. Hill are herein incorporated in their entirety by reference.

Beam 334 comprises the measurement beams of the two zero shear interferometers that contact reflecting surface 51. The path of beam 334 corresponds to the path indicated by numeral 12 in FIG. 1. The two zero shear interferometers measure changes in displacements $x_3$ and $x_{30}$, respectively, of reflecting surface 51 along corresponding measurement axes. Displacements $s_3$ and $s_{30}$ in FIG. 2e correspond to displacements $x_3$ and $x_{30}$. Measured values of displacements $x_3$ and $x_{30}$ are used to determine the displacement of reflecting surface 51 along a subsystem measurement axis and to determine the average change in orientation of reflecting surface 51 associated with two points on reflecting surface 51 separated by distance $b_3$ in the x-y plane.

The change in a local slope of reflective surface 51 in the x-y plane is determined by measuring the change in direction of a beam that has been reflected once by reflecting surface 51. For this purpose, a portion of the output beam of the $x_3$ measuring active zero shear interferometer is reflected by beam-splitter BS4 as beam 336. The measurement beam component of beam 336 has made a single pass to reflecting surface 51.

Figure 2F:
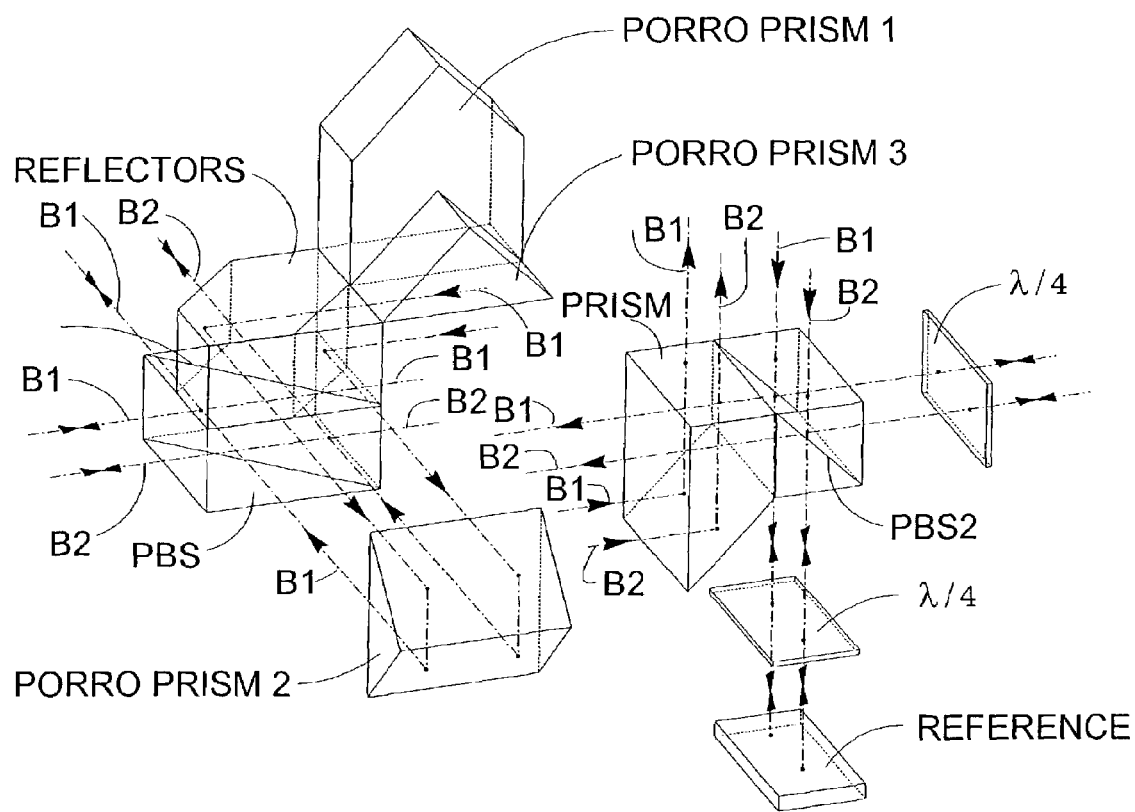
FIG. 2f is an exploded diagrammatic perspective view of a portion of the embodiment of FIG. 2e.
Figure 2G:
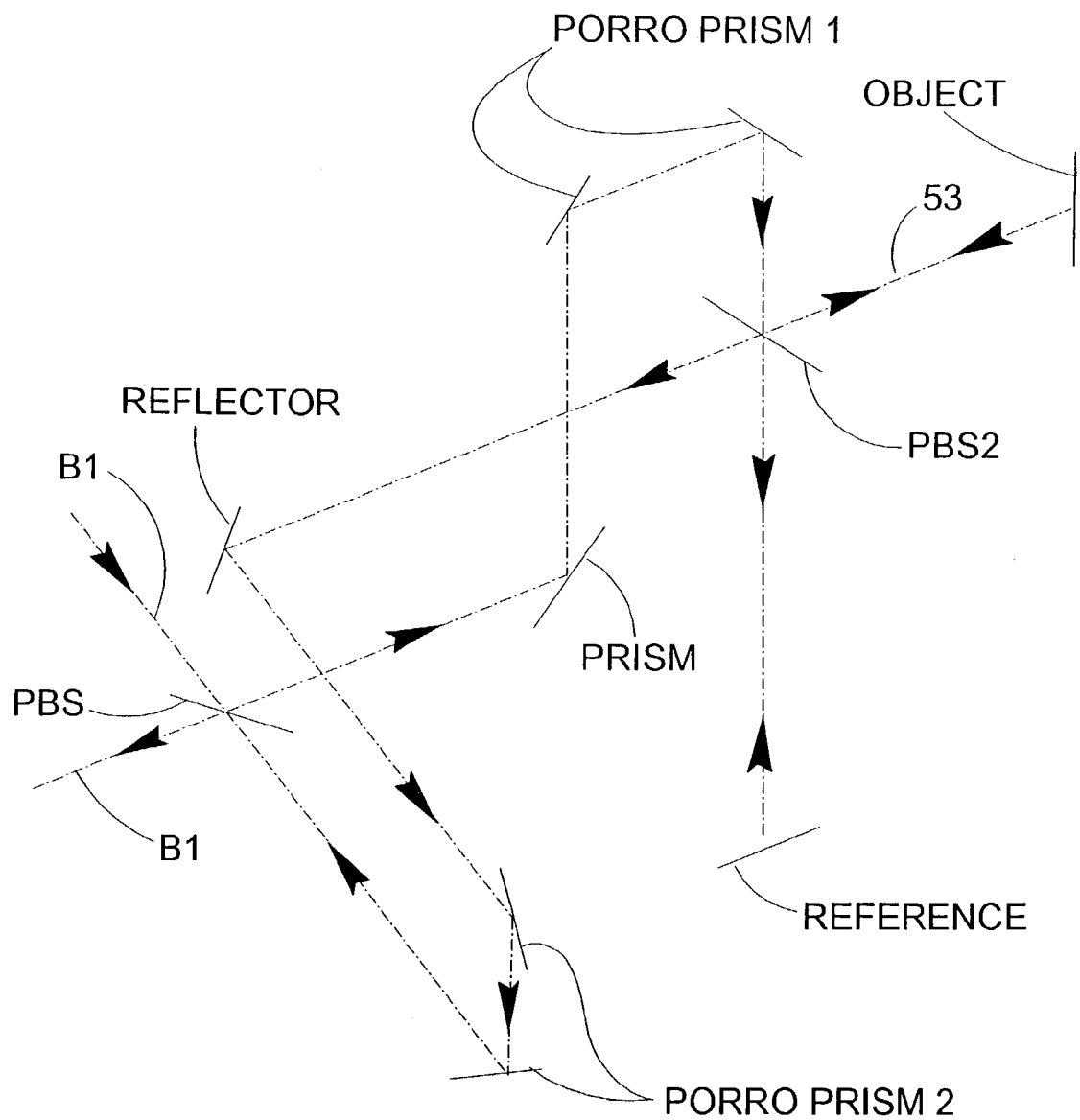
FIG. 2g is a diagrammatic perspective view of the paths of certain beams as they propagate through one branch of the assembly of components shown in FIG. 2f.

Changes in direction of propagation of beam 336 are measured by angular displacement interferometer 1010 shown schematically in FIG. 2b. As a consequence of the use of the active zero shear interferometers, there is zero differential beam shear between the reference and measurement beam components of beam 336 and reduced beam shear for each of the components of beam 336. The remaining description of the third embodiment with respect to angular displacement interferometer measurements is the same as corresponding portions of the description given for the angular displacement interferometer measurements in the first and second embodiments. Reference may be had to FIG. 2f which shows an exploded diagrammatic perspective of the central subassembly of FIG. 2e which includes the PBS, prism and Porro Prisms. FIG. 2g shows the path of travel of beam B1 as it propagates through one branch of the subassembly of FIG. 2f to and from one of the two separate locations on the mirror.

While system 15 is normally operated to measure y translation, it is operated in a mirror characterization mode to measure the shape of mirror surface 51 in situ along a datum line in the x-y plane thereof. In the mirror characterization mode, stage 16 is translated in the y-direction so that measurement beam of interferometer 10 scans the mirror surface 51 along a datum line and generates signals containing information indicative of its angular orientation and surface departure in the x-y plane from a plane in the x-direction, along with any contributions due to variations in the translation mechanism for moving stage 16, cyclic non-linearities, and stationary and non-stationary effects of a gas in measurement paths of beams of interferometers 10 and 20.

Simultaneous with translation of stage 16 in the y-direction, interferometer 20 monitors orientation of mirror 61 for a fixed intercept point of the measurement beam of interferometer 20 with reflecting surface 61. This step permits measurement of the rotation of stage 16 due to mechanical contributions of its translation mechanism, such as bearings, drive mechanisms, and the like. With this information, two signals are generated. The first signal is from interferometer 10 which contains information about the change in combined angular orientation of stage 16 and the local slope in the x-y plane of reflecting surface 51 and the change in combined angular orientation of stage 16 and the average slope in the x-y plane of reflecting surface 51 and the second signal is from interferometer 20 which contains information about the angular orientation of stage 16 as a function of displacement in the y-direction.

Information about a local slope and about an average slope on the reflecting surface 61 is not used in determining properties of the datum line in reflecting surface 51 because the position of stage 16 is not changing in the x-direction during the scan in the y-direction.

The first and second signals are processed in electronic processor 380 and computer 382 to extract information about the average slope and the local slope in a x-y plane of mirror 51 along its datum line, i.e., <dx/dy> and $(dx/dy)_{local}$, respectively. <dx/dy> and $(dx/dy)_{local}$ are then processed by electronic processor 380 and computer 382 using integral transforms of <dx/dy> and $(dx/dy)_{local}$ to obtain the x displacement $X_3(y)$ of the datum line in the x-y plane as a function of y. The description of the processing in the third embodiment is the same as the description given for the corresponding processing in the first embodiment. The datum line represents departures of the surface of reflecting surface 51 in the x-y plane from a straight line but does not represent the orientation of the straight line in the x-y plane.

An advantage of the third embodiment is that the effects of cyclic errors are generally reduced as a result of using active zero shear interferometers. The residual effects of cyclic errors are however compensated in the third embodiment if required in an end use application in the determination of measured quantities <dx/dy> and $(dx/dy)_{local}$. The description of the techniques used for the compensation of the residual effects of cyclic errors is the same as the corresponding portions of the description given for the first embodiment.

Effects of stationary and non-stationary changes of a gas in the measurement paths 12 and 22 are compensated in the third embodiment for those end use applications where required. The description of the techniques used for the compensation of the effects of stationary and non-stationary changes of a gas in the measurement paths 12 and 22 is the same as the corresponding portions of the description given for the first embodiment.

A corresponding datum line is next generated for reflecting surface 61 by scanning in the x direction and repeating the procedure described for the generation of the datum line in reflecting surface 51.

An advantage of the third embodiment is that as a consequence of the zero shear feature of output beams of interferometers in the third embodiment, there is no restriction on the angular orientation of stage 16 such as encountered for the first embodiment of the present invention. In the first embodiment, stage 16 was preferably orientated so that there was nominally no beam shear of the measurement beam components of the output beams of the interferometers used for measuring changes in local slopes. This restriction is present in the first embodiment and in the variant of the second embodiment so as to obtain optimal electrical interference signals with respect to amplitude from the angle interferometers used to measure local slopes.

Another advantage of the third embodiment is that as a consequence of the zero shear feature and the no restriction on the angular orientation of stage 16, the mirror characterization mode of the third embodiment may be incorporated into the processing of wafers as part of an in-process wafer procedure that does not interfere with through put of a lithography tool. As a further consequence, the shape of the reflecting surfaces such as 51 and 61 may be monitored for changes with respect to time in situ without interfering with through put of a lithography tool.

The two active zero shear interferometers and angular displacement interferometer 1010 in interferometers 10 and 20 comprise integral optical assemblies in the third embodiment. This is an important feature of the third embodiment in that use of integral optical assemblies contributes to increased stability of the interferometers 10 and 20 with respect to precision of measurements and compactness of design.

The remaining description of the third embodiment is the same as corresponding portions of the description given for the first and second embodiments of the present invention.

The first three embodiments of the present invention furnish determinations of datum lines with high spatial resolution in x-y planes in the surfaces of reflecting surfaces 51 and 61. The next three embodiments of the present invention furnish determinations of a pair of datum lines with high spatial resolution in x-y planes in each of reflecting surfaces 51 and 61 without making a scan or displacements of stage 16 orthogonal to the x-y plane, i.e., along the z-axis.

Figure 3A:
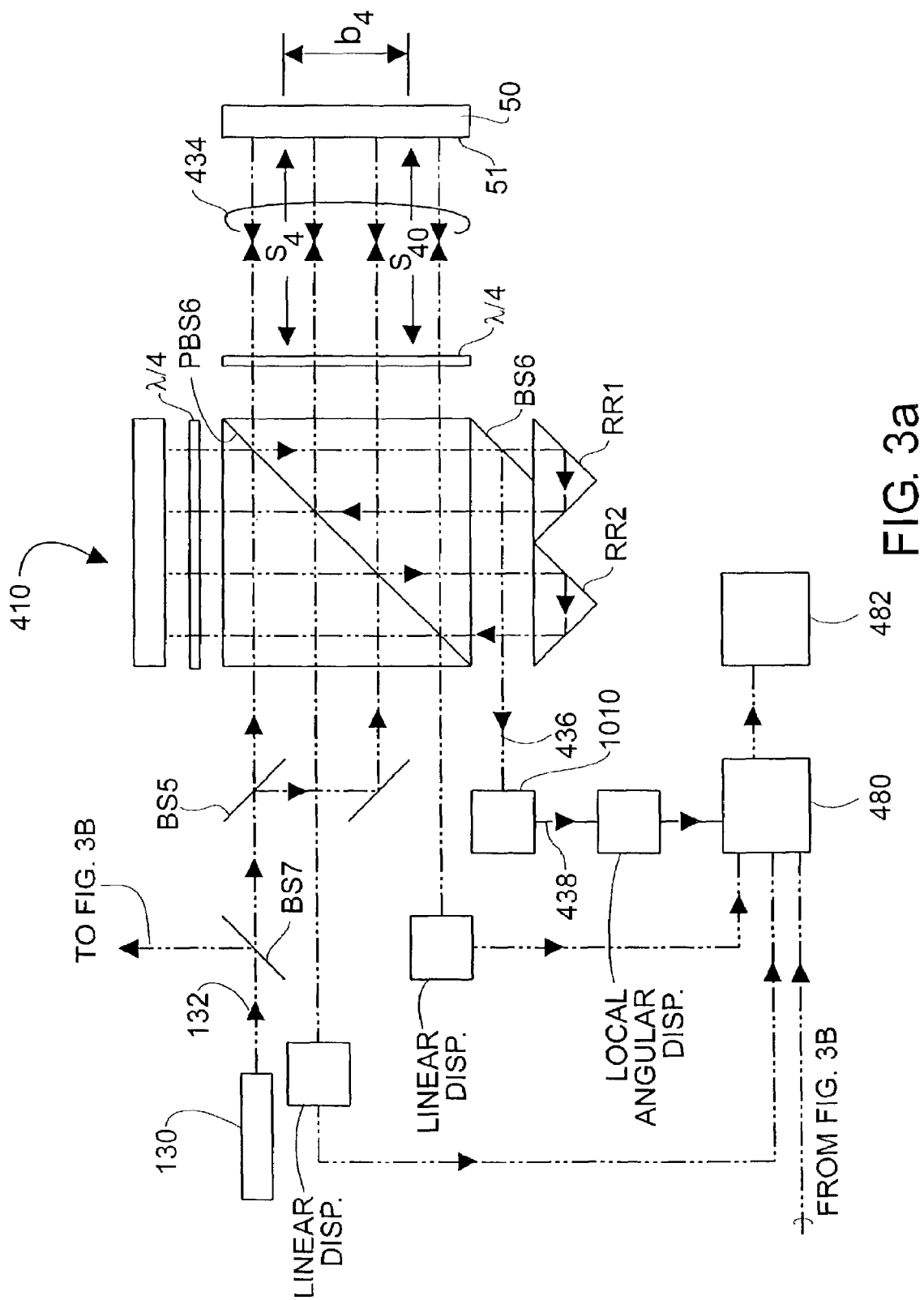
FIGS. 3a and 3b are diagrammatic plan views of a fourth embodiment of the interferometers of FIG. 1 and are of a plane mirror type comprising two interferometer subsystems wherein each of the two interferometer subsystems are the same as the interferometer subsystem of the first embodiment; the two interferometer subsystems being separated by a distance $b_5$ in the z direction and are combined in an integral optical assembly.

A fourth embodiment of interferometers 10 and 20 is of a plane mirror type indicated generally as 410 in FIG. 3a and configured such that the shape of on-stage mounted elongated object mirrors 50 and 60 represented by a pair of datum lines for each of mirrors 50 and 60 may be characterized in situ with high spatial resolution in two x-y planes. The pairs of datum lines lie in the reflecting surfaces 51 and 61.

Figure 3B:
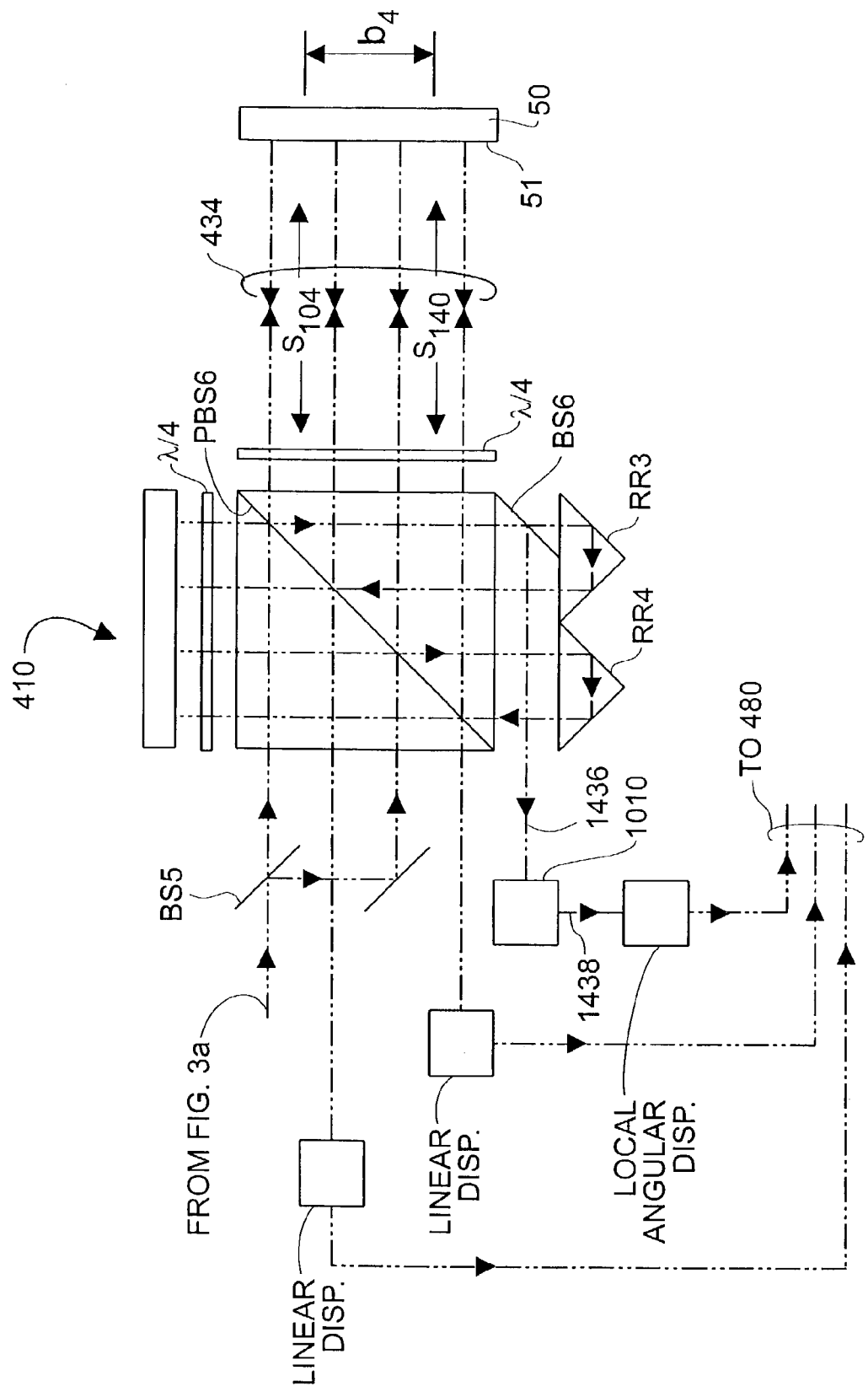

Interferometer subsystem 410 shown schematically in FIGS. 3a and 3b comprises two interferometer subsystems wherein each of the two interferometer subsystems are the same as interferometer subsystem 110 of the first embodiment. The two interferometer subsystems are separated by a distance $b_5$ in the z-direction and are combined in stacked fashion in an integral optical assembly. Elements in FIGS. 3a and 3b that have the same numbers represent single elements with sufficient size to serve similar functions in FIGS. 3a and 3b so as to reduce the number of parts and contribute to construction of an integral optical assembly. The two interferometer subsystems measure changes in displacements $x_4$ and $x_{40}$ and displacements $x_{104}$ and $x_{140}$ of reflecting surface 51 along corresponding measurement axes. Displacements $x_4$ and $x_{40}$ and displacements $x_{104}$ and $x_{140}$ correspond to displacements $s_4$ and $s_{40}$ and displacements $s_{104}$ and $s_{140}$, respectively, in FIGS. 3a and 3b, respectively.

Displacements $x_4$ and $x_{40}$ lie in one x-y plane of FIG. 3a and displacements $x_{104}$ and $x_{140}$ lie in a second x-y plane of FIG. 3b wherein the first and second x-y planes are separated in the z direction by a distance $b_5$. Measured values of displacements $x_4$ and $x_{40}$ and displacements $x_{104}$ and $x_{140}$ are used to determine the displacement of reflecting surface 51 along subsystem measurement axes separated in the z direction by a distance $b_5$. The measured values of differences of displacements $x_4$ and $x_{40}$ and differences of displacements $x_{104}$ and $x_{140}$ are used to determine the average slopes of reflecting surface 51 in the first and second x-y planes, respectively. The definition of an average slope with respect to the fourth embodiment is the same as the definition of an average slope given for the first embodiment of the present invention. The changes in local slopes of reflective surface 51 in the first and second x-y planes are determined by measuring the change in direction of two beams that each have been reflected once by reflecting surface 51 at positions separated in the z direction by a distance $b_5$.

While system 15 is normally operated to measure y translation, it is operated in a special mirror characterization mode to measure the shape of mirror surface 51 in situ along a datum lines thereof. In the special mirror characterization mode, stage 16 is translated in the y-direction so that measurement beam of interferometer 410 scans the mirror surface 51 along a pair of datum lines separated in z and generates signals containing information indicative of its angular orientation and surface departure in the first and second x-y planes from planes in the x-direction, along with any contributions due to variations in the translation mechanism for moving stage 16, cyclic non-linearities, and stationary and non-stationary effects of a gas in measurement paths of beams of interferometers 10 and 20. The orientation of stage 16 is preferably selected for the special mirror characterization mode such that there is nominally zero shear of the measurement beam components of the output beams of the four HSPMIs and the input beams to the two angular displacement interferometers 1010.

Simultaneous with translation of stage 16 in the y-direction, interferometer 20 monitors orientation of mirror 61 for a fixed intercept point of the measurement beam of interferometer 20 with reflecting surface 61. This step permits measurement of the rotation of stage 16 due to mechanical contributions of its translation mechanism, such as bearings, drive mechanisms, and the like. With this information, two signals are generated. The first signal is from interferometer 10 comprising a set of four signals that contains information about the change in combined angular orientation of stage 16 and the local slopes of reflecting surface 51 and the change in combined angular orientation of stage 16 and average slopes of reflecting surface 51 along the two datum lines and the second signal is from interferometer 20 which contains information about the angular orientation of stage 16 as a function of displacement in the y-direction.

Information about local slopes on the reflecting surface 61 is not used in determining properties of the two datum lines in reflecting surface 51 because the position of stage 16 is not changing in the x-direction during the scan in the y-direction. The first and second signals are processed by electronic processor 480 and computer 482 for information about the average slope and the local slope of mirror 51 along the two datum lines, i.e., $<dx/dy>_4$ and $((dx/dy)_{local})_4$, respectively, along one of the datum lines and $<dx/dy>_5$ and $((dx/dy)_{local})_5$, respectively, along the second of the two datum lines. $<dx/dy>_4$, $((dx/dy)_{local})_4$, $<dx/dy>_5$, and $((dx/dy)_{local})_5$ are then processed in electronic processor 480 and computer 482 using integral transforms of $<dx/dy>_4$, $((dx/dy)_{local})_4$, $<dx/dy>_5$, and $((dx/dy)_{local})_5$ to obtain the x displacements $X_4(y)$ and $X_{40}(y)$ of the two datum lines in the first and second x-y planes as a function of y. The description of the processing in the fourth embodiment is the same as the description given for the corresponding processing in the first embodiment.

The effects of cyclic errors are compensated if required in an end use application of the fourth embodiment in the determination of measured quantities $<dx/dy>_4$, $((dx/dy)_{local})_4$, $<dx/dy>_5$, and $((dx/dy)_{local})_5$. The description of the techniques used for the compensation of the effects of cyclic errors is the same as the corresponding portions of the description given for the first embodiment.

Effects of stationary and non-stationary changes of a gas in the measurement paths 12 and 22 are compensated in the fourth embodiment for end use applications where required. The description of the techniques used for the compensation of the effects of stationary and non-stationary changes of a gas in the measurement paths 12 and 22 is the same as the corresponding portions of the description given for the first embodiment.

An advantage of the fourth embodiment is that the shape of two datum lines in the reflecting surface of a stage mirror may be determined without having to make a scan or displacement of stage 16 in the z direction.

An important feature of the fourth embodiment is that interferometers 10 and 20 can each be integral optical assemblies that contribute to increased stability of the interferometers with respect to precision of measurements and compactness of design.

The remaining description of the fourth embodiment is the same as corresponding portions of the description given for the first embodiment of the present invention.

Figure 3C:
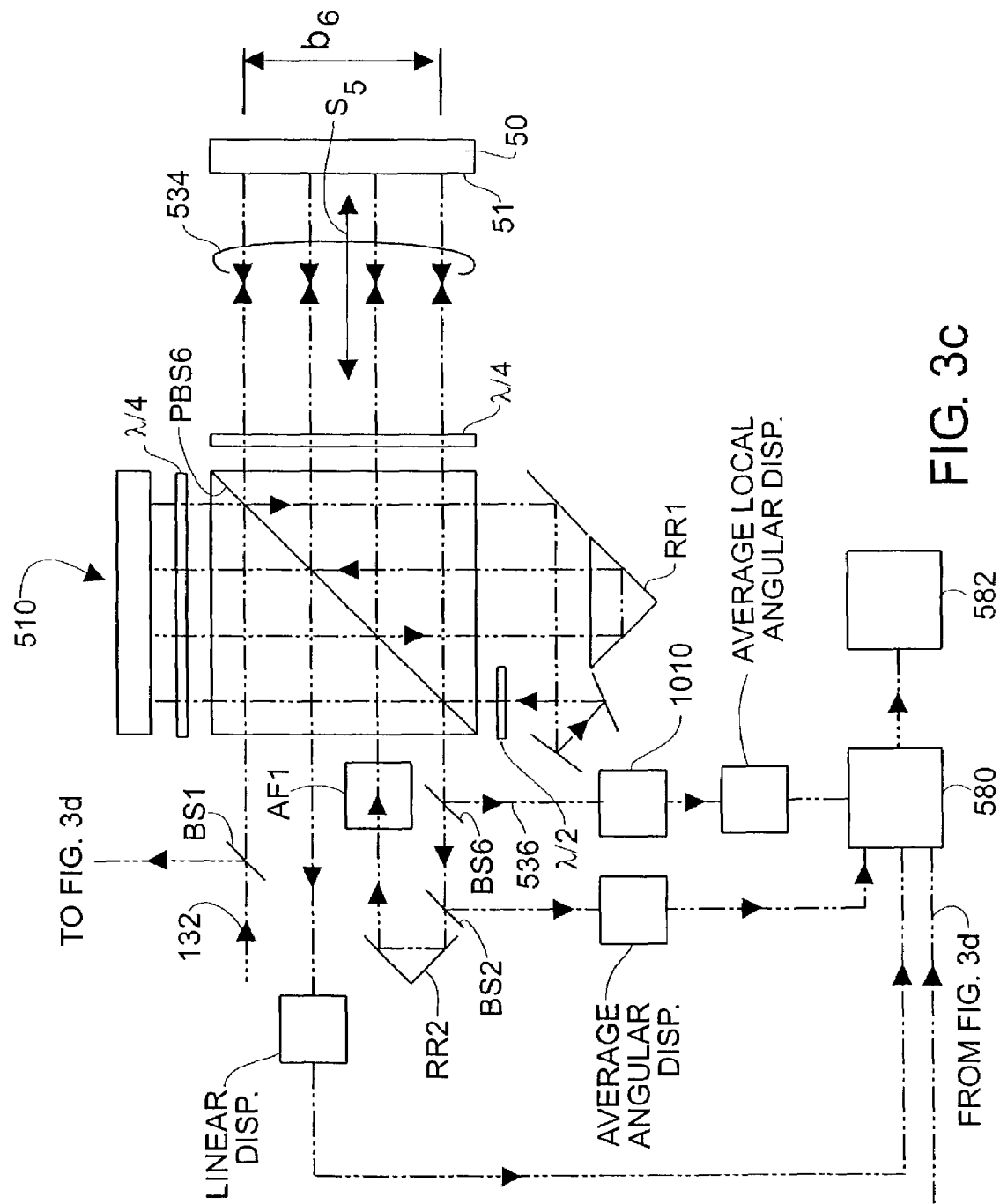
FIGS. 3c and 3d diagrammatically show two interferometer subsystems comprising a fifth embodiment wherein each of the two interferometer subsystems are the same as the interferometer subsystem of the second embodiment.
Figure 3D:
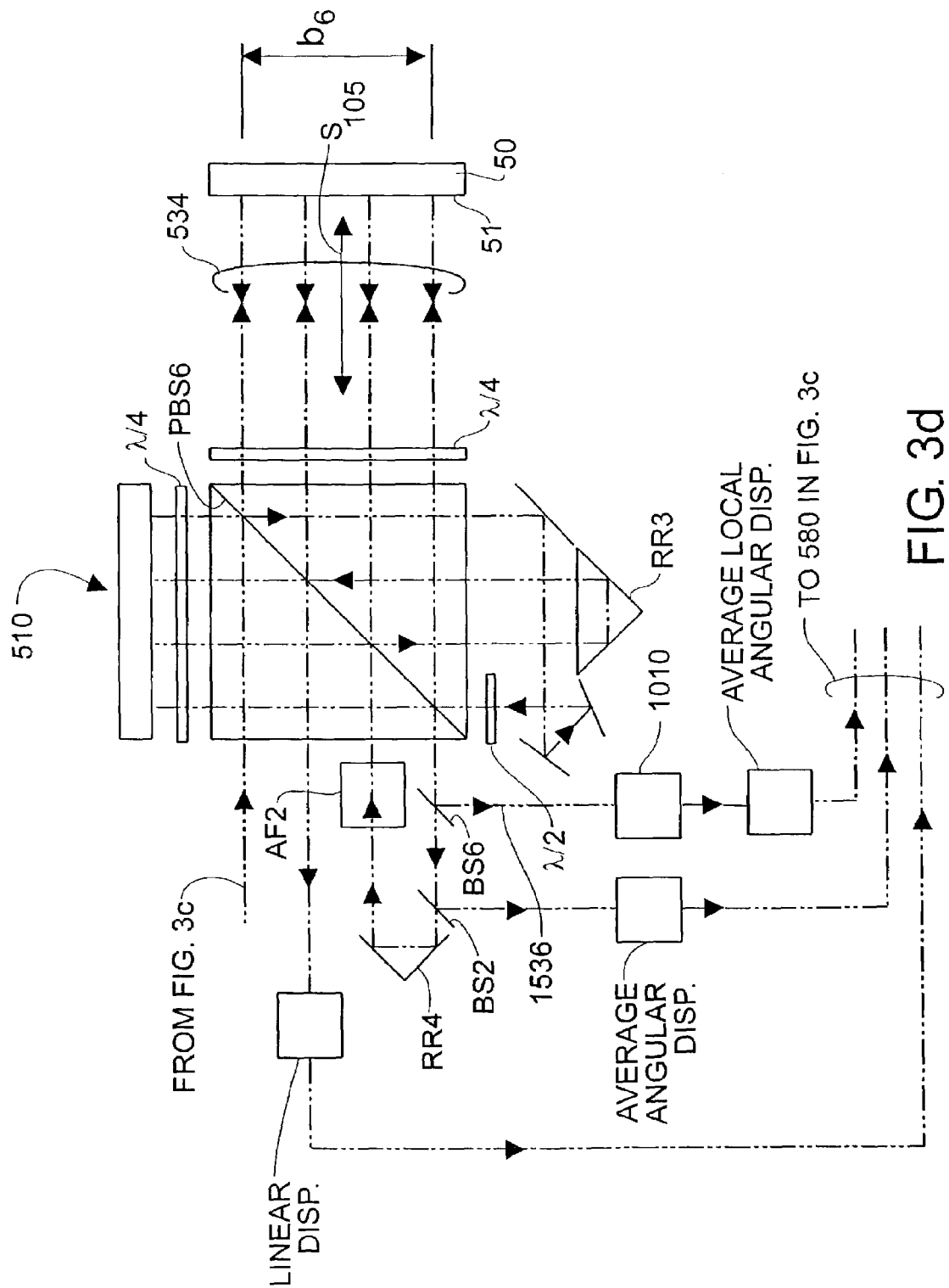

A fifth embodiment of interferometers 10 and 20 is of a zero differential shear type indicated generally as 510 in FIGS. 3c and 3d and configured such that the shape of on-stage mounted elongated object mirrors 50 and 60 represented by a pair of datum lines for each of mirrors 50 and 60 may be characterized in situ with high spatial resolution in two x-y planes. The pairs of datum lines lie in the surfaces of reflecting surfaces 51 and 61.

Interferometer subsystem 510 shown schematically in FIGS. 3c and 3d comprises two interferometer subsystems wherein each of the two interferometer subsystems are the same as interferometer subsystem 210 of the second embodiment. The interferometer subsystems are separated by a distance $b_7$ in the z direction and are combined as a stack in an integral optical assembly. Elements in FIGS. 3c and 3d that have the same numbers represent single elements with sufficient size to serve similar functions in FIGS. 3c and 3d so as to reduce the number of parts and contribute to construction of an integral optical assembly. The interferometer subsystems measure changes in displacements $x_5$ and $x_{50}$ of reflecting surface 51 along subsystem measurement axis, changes in average slopes $<dx/dy>_5$ and $<dx/dy>_{50}$, and changes in average local slopes $<(dx/dy)_{local}>_5$ and $<(dx/dy)_{local}>_{50}$ of a reflective surface in two x-y planes of FIGS. 3c and 3d separated by the distance $b_7$. Displacements $x_5$ and $x_{50}$ correspond to displacements $s_5$ and $s_{50}$, respectively, in FIGS. 3c and 3d, respectively. Displacement $x_5$, average slope $<dx/dy>_5$, and average local slope $<(dx/dy)_{local}>_5$ lie in one x-y plane of FIG. 3c and displacement $x_{50}$, average slope $<dx/dy>_{50}$, and average local slope $<(dx/dy)_{local}>_{50}$ lie in a second x-y plane of FIG. 3d wherein the first and second x-y planes are separated in the z direction by a distance $b_7$. The definitions of the average slope and the average local slope are the same as the corresponding definitions of an average slope and an average local slope given for the second embodiment of the present invention.

A change in an average local slope of reflective surface 51 in an x-y plane is determined by measuring the change in direction of reference and measurement beams that each have been reflected once by reflecting surface 51 at positions separated in the y direction by a distance $b_6$.

While system 15 is normally operated to measure y translation, it is operated in a mirror characterization mode to measure the shape of mirror surface 51 in situ along a pair of datum lines thereof. In the mirror characterization mode, stage 16 is translated in the y-direction so that the measurement beam of interferometer 10 scans the mirror surface 51 along a pair of datum lines separated in z and generates signals containing information indicative of its angular orientation and surface departure in the first and second x-y planes from a plane in the x-direction, along with any contributions due to variations in the translation mechanism for moving stage 16, cyclic non-linearities, and stationary and non-stationary effects of a gas in measurement paths of beams of interferometers 10 and 20.

Simultaneous with translation of stage 16 in the y-direction, interferometer 20 monitors orientation of mirror 61 for a fixed intercept point of the measurement beam of interferometer 20 with reflecting surface 61. This step permits measurement of the rotation of stage 16 due to mechanical contributions of its translation mechanism, such as bearings, drive mechanisms, and the like. With this information, two signals are generated. The first signal is from interferometer 10 comprising a set of four signals that contains information about the change in combined angular orientation of stage 16 and the average local slopes of reflecting surface 51, and the change in combined angular orientation of stage 16 and average slopes of reflecting surface 51 along the pair of datum lines and the second signal is from interferometer 20 which contains information relevant to the angular orientation of stage 16 as a function of displacement in the y-direction.

Information about local slopes on the reflecting surface 61 is not used in determining properties of the two datum lines in reflecting surface 51 because the position of stage 16 is not changing in the x-direction during the scan in the y-direction. The first and second signals are processed by electronic processor 580 and computer 582 for information about the average slope and the average local slope of mirror 51 along one of the pair of datum lines, i.e., $<dx/dy>_6$ and $<(dx/dy)_{local}>_6$, respectively, and the average slope and the average local slope of mirror 51 along the second of the pair of datum lines, i.e., $<dx/dy>_7$ and $<(dx/dy)_{local}>_7$, respectively. $<dx/dy>_6$, $<(dx/dy)_{local}>_6$, $<dx/dy>_7$, and $<(dx/dy)_{local}>_7$ are then processed by electronic processor 480 and computer 482 using integral transforms of $<dx/dy>_6$, $<(dx/dy)_{local}>_6$, $<dx/d>_7$, and $<(dx/dy)_{local}>_7$ to obtain the x displacements $X_5$ and $X_{50}$ of the pair of datum lines in the first and second x-y planes as a function of y. The description of the processing in the fifth embodiment is the same as the description given for the corresponding processing in the second embodiment.

The zero differential beam shear property of interferometer 510 leads to reduced amplitudes of cyclic errors in electrical interference signals generated by each of the six interferometers of each of interferometers 10 and 20. This is a consequence of the use of single pass interferometers for the measurement of the average slopes and for the generation of the input beams for the linear displacement interferometers and the local slope interferometers. The residual effects of cyclic errors are however compensated if required in an end use application of the fifth embodiment in the determination of measured quantities $<dx/dy>_6$, $<(dx/dy)_{local}>_6$, $<dx/dy>_7$, and $<(dx/dy)_{local}>_7$. The description of the techniques used for the compensation of the residual effects of cyclic errors is the same as the corresponding portions of the description given for the first embodiment.

Effects of stationary and non-stationary changes of a gas in the measurement paths 12 and 22 are compensated in the fifth embodiment for those end use applications where required. The description of the techniques used for the compensation of the effects of stationary and non-stationary changes of a gas in the measurement paths 12 and 22 is the same as the corresponding portions of the description given for the first embodiment.

Advantages of the fifth embodiment with respect to beam diameters and higher spatial frequency information, zero differential shear, and integral optical assemblies are the same as corresponding advantages of the second embodiment of the present invention. The remaining description of the fifth embodiment is the same as corresponding portions of the descriptions given for the second and fourth embodiments of the present invention.

Figure 3E:
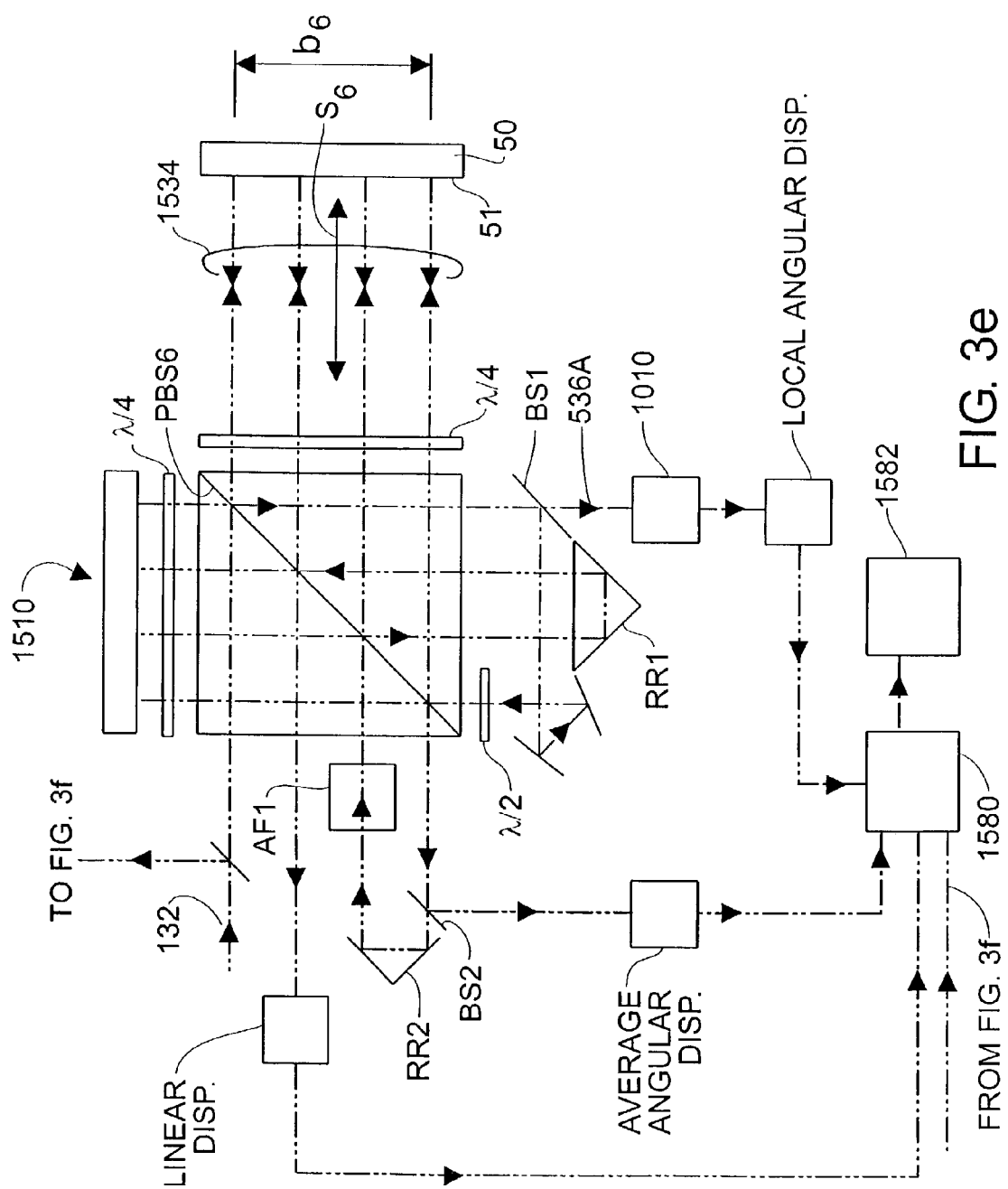
FIGS. 3e and 3f diagrammatically show a variant of the fifth embodiment of interferometers of FIG. 1 of a passive zero shear type, more specifically a zero differential shear type.
Figure 3F:
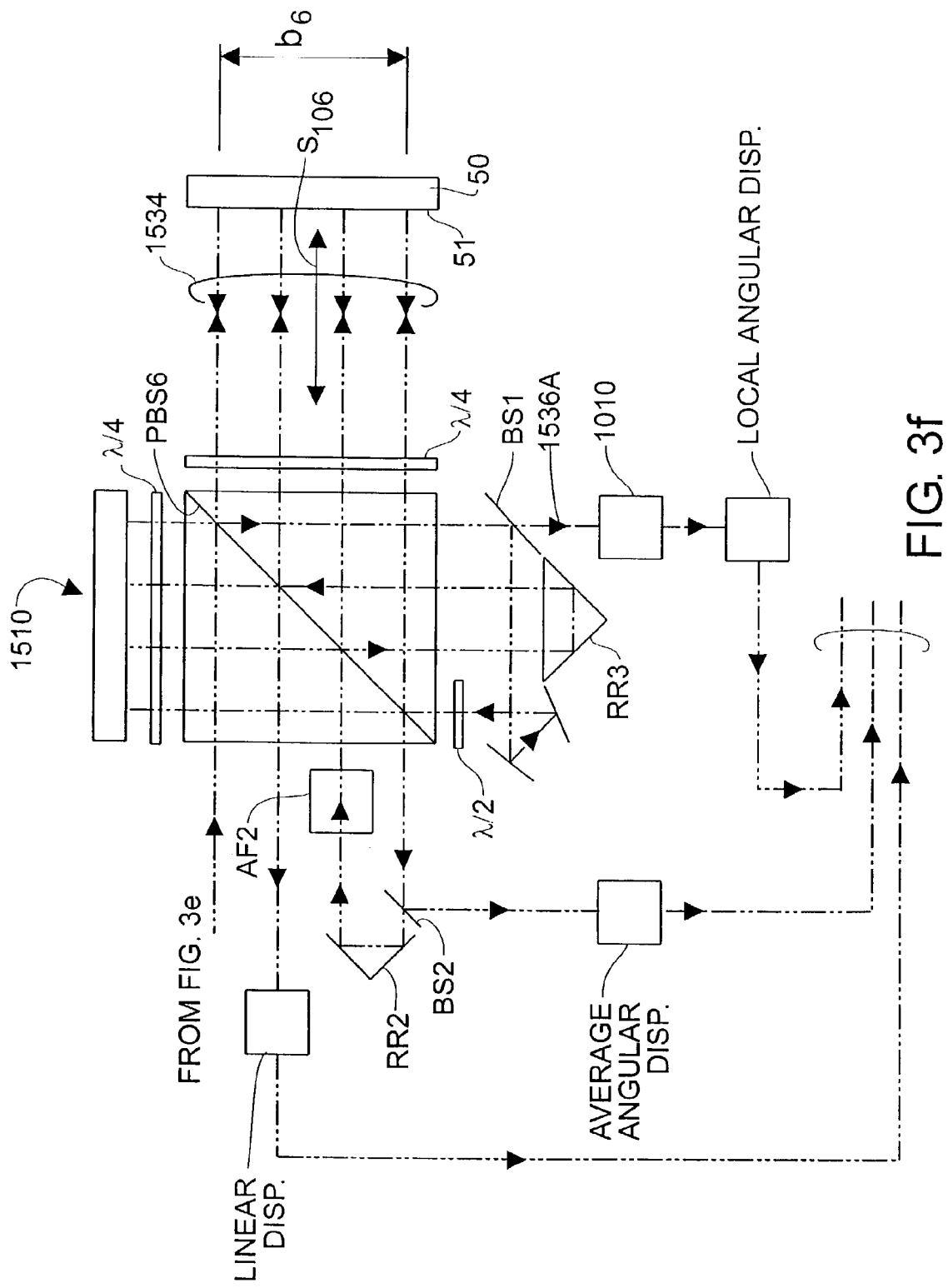

A variant of the fifth embodiment of interferometers 10 and 20 is of a passive zero shear type, more specifically a zero differential shear type, indicated generally as 1510 in FIGS. 3e and 3f and configured such that the shape of on-stage mounted elongated object mirrors 50 and 60 represented by a pair of datum lines for each of mirrors 50 and 60 may be characterized in situ with high spatial resolution in two x-y planes. The pairs of datum lines lie in the surfaces of reflecting surfaces 51 and 61. The variant of the fifth embodiment differs from the fifth embodiment in the generation of information of local angular displacements. In the variant of the fifth embodiment, changes in local angular displacements are measured and in the fifth embodiment, changes in average local angular displacements are measured. The variant of the fifth embodiment is to the fifth embodiment as the variant of the second embodiment is to the second embodiment.

Interferometers 10 and 20 of the variant of the fifth embodiment comprise many elements that have the same element numbers as elements of the variant of the second embodiment wherein the elements having the same element numbers perform like functions. The interferometer subsystems are separated by a distance $b_9$ in the z direction and are combined in stacked fashion as an integral optical assembly. Elements in FIGS. 3e and 3f that have the same numbers represent single elements with sufficient size to serve similar functions in FIGS. 3e and 3f so as to reduce the number of parts and contribute to construction of an integral optical assembly. The change in local slopes of reflective surface 51 in x-y planes of FIGS. 3e and 3f are determined by measuring the changes in direction of beams that have been reflected once by reflecting surface 51.

An important feature of the variant of the fifth embodiment is that interferometers 10 and 20 can each be integral optical assemblies that contribute to increased stability of the interferometers with respect to precision of measurements and compactness of design.

The variant of the fifth embodiment measures changes in a local slope and changes in an average slope the same as the variant of the second embodiment and as the first embodiment of the present invention. As a consequence, the remaining description of the variant of the fifth embodiment is the same as the corresponding portions of the descriptions given for the first embodiment, the variant of the second embodiment and the fifth embodiment.

Figure 3G:
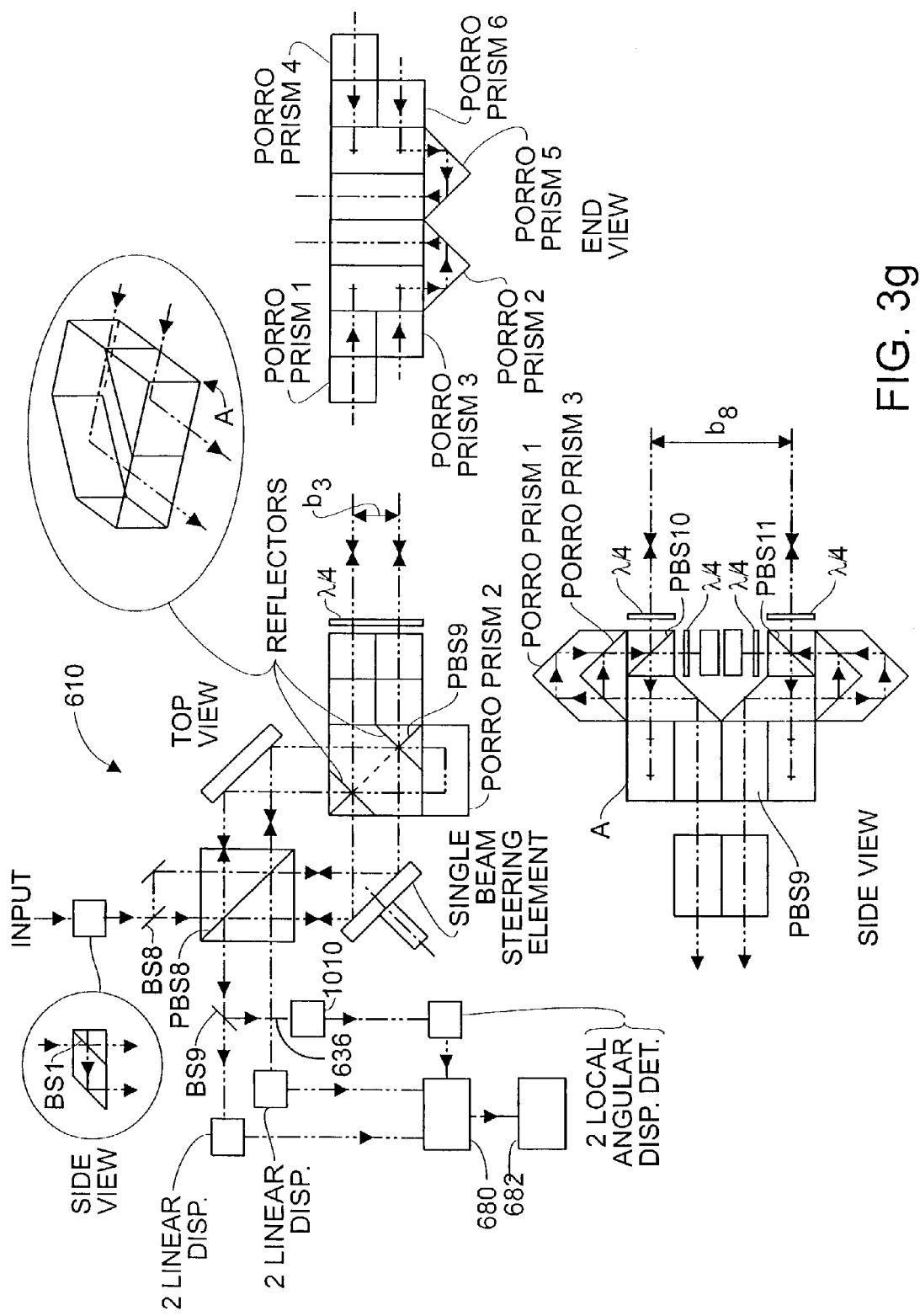
FIG. 3g is diagrammatic plan view of a sixth embodiment of interferometers of FIG. 1 of a zero shear type.

A sixth embodiment of interferometers 10 and 20 is of a zero shear type indicated generally as 610 in FIG. 3g and configured such that the shape of on-stage mounted elongated object mirrors 50 and 60 represented by a pair of datum lines for each of mirrors 50 and 60 may be characterized in situ with high spatial resolution in two x-y planes. The pairs of datum lines lie in the reflecting surfaces 51 and 61.

Figure 3H:
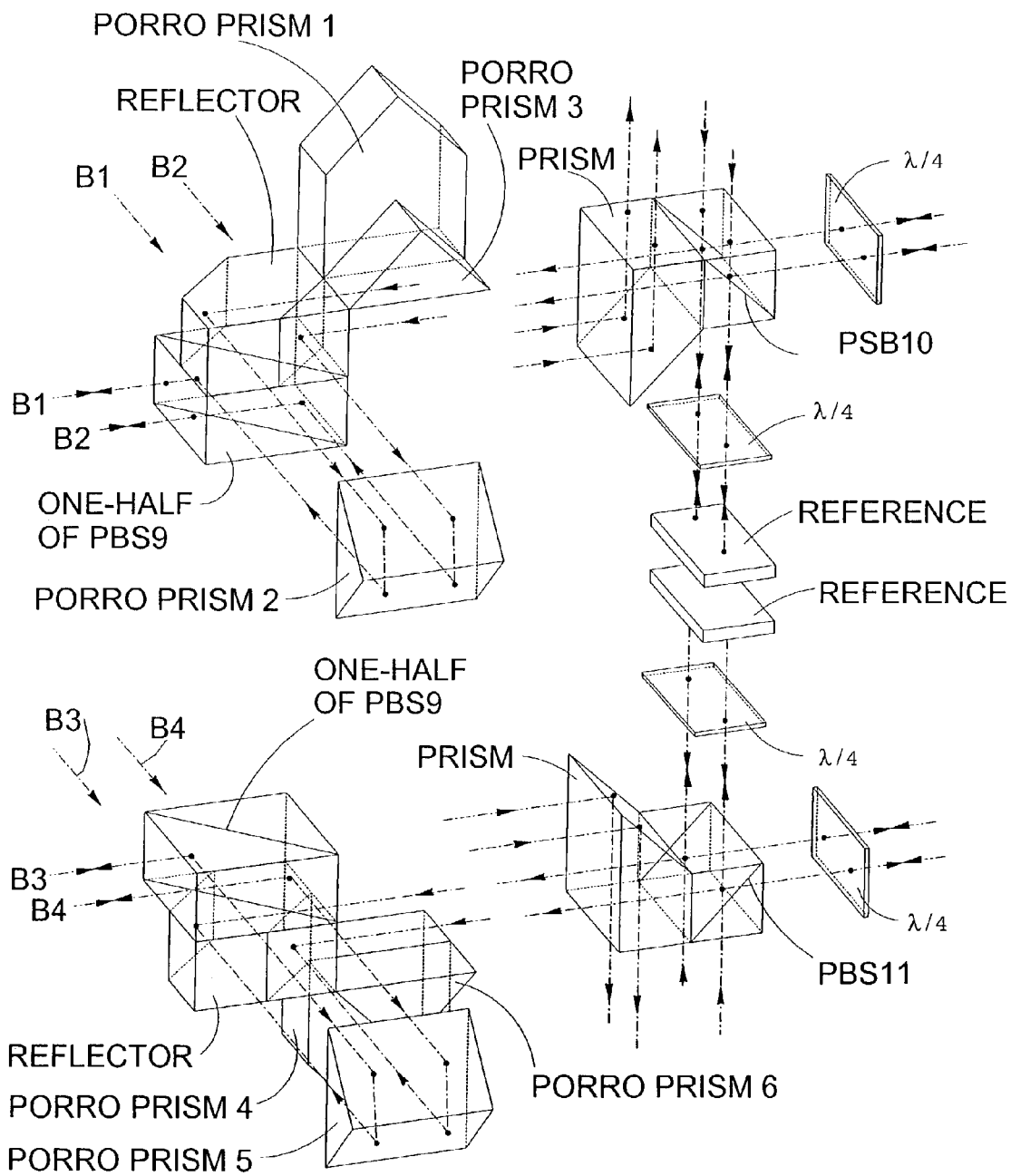
FIG. 3h is an exploded diagrammatic perspective view of a subassembly of certain components of FIG. 3g.

Interferometer subsystem 610 shown schematically in FIG. 3g comprises two interferometer subsystems that share a common beam steering element wherein each of the interferometer subsystems are the same as interferometer subsystem 310 of the third embodiment, but with central subassemblies that are mirror images of one another as shown in FIG. 3h. The interferometer subsystems are separated by a distance $b_9$ in the z direction and combined in an integral optical assembly. Elements in FIGS. 3g and 3h that have the same numbers represent single elements with sufficient size to serve similar functions in FIGS. 3g and 3h so as to reduce the number of parts and contribute to construction of an integral optical assembly. The interferometer subsystems measure changes in displacements of reflecting surface 51 along a system measurement axis and changes in average slopes and in a local slopes of a reflective surface in two x-y planes separated by the distance $b_9$. FIG. 3h is an exploded diagrammatic perspective of the central subassembly of FIG. 3g comprising the various PBSs, Porro prisms, and other prismatic elements.

While system 15 is normally operated to measure y translation, it is operated in a mirror characterization mode to measure the shape of mirror surface 51 in situ along a pair of datum lines in two x-y planes thereof. In the mirror characterization mode, stage 16 is translated in the y-direction so that measurement beam of interferometer 10 scans the mirror surface 51 along the pair of datum lines and generates signals containing information indicative of its angular orientation and surface departure in the two x-y planes from a plane in the x-direction, along with any contributions due to variations in the translation mechanism for moving stage 16, cyclic non-linearities, and stationary and non-stationary effects of a gas in measurement paths of beams of interferometers 10 and 20.

Simultaneous with translation of stage 16 in the y-direction, interferometer 20 monitors orientation of mirror 61 for a fixed intercept point of the measurement beam of interferometer 20 with reflecting surface 61. This step permits measurement of the rotation of stage 16 due to mechanical contributions of its translation mechanism, such as bearings, drive mechanisms, and the like. With this information, two signals are generated. The first signal is from interferometer 10 comprising a set of four signals that contains information about the change in combined angular orientation of stage 16 and the local slopes of reflecting surface 51, and the change in combined angular orientation of stage 16 and average slopes of reflecting surface 51 along the pair of datum lines and the second signal is from interferometer 20 which contains information relevant to the angular orientation of stage 16 as a function of displacement in the y-direction.

Information about local slopes on the reflecting surface 61 is not used in determining properties of the two datum lines in reflecting surface 51 because the position of stage 16 is not changing in the x-direction during the scan in the y-direction. The first and second signals are processed in electronic processor 680 and computer 682 for information about the average slope and the local slope of mirror 51 along one of the pair of datum lines, i.e., $<dx/dy>_8$ and $((dx/dy)_{local})_8$, respectively, and the average slope and the local slope of mirror 51 along the second of the pair of datum lines, i.e., $<dx/dy>_9$ and $((dx/dy)_{local})_9$, respectively. The average slopes and the local slopes are then processed by electronic processor 680 and computer 682 using integral transforms to obtain the x displacements of the pair of datum lines in the first and second x-y planes as a function of y. The description of the processing in the sixth embodiment is the same as the description given for the corresponding processing in the first embodiment.

The zero beam shear property of interferometer 610 leads to reduced amplitudes of cyclic errors in electrical interference signals generated by each of the six interferometers of each of interferometers 10 and 20. The residual effects of cyclic errors are however compensated if required in an end use application of the sixth embodiment in the determination of measured quantities $<dx/dy>_8$, $(dx/dy)_8$, $((dx/dy)_{local})_8$, and $((dx/dy)_{local})_9$. The description of the techniques used for the compensation of the residual effects of cyclic errors is the same as the corresponding portions of the description given for the first embodiment.

Effects of stationary and non-stationary changes of a gas in the measurement paths 12 and 22 are compensated in the sixth embodiment for those end use applications where required. The description of the techniques used for the compensation of the effects of stationary and non-stationary changes of a gas in the measurement paths 12 and 22 is the same as the corresponding portions of the description given for the first embodiment.

An important feature of the sixth embodiment is that interferometers 10 and 20 can each be integral optical assemblies that contribute to increased stability of the interferometers with respect to precision of measurements and compactness of design.

Advantages of the sixth embodiment with respect to zero shear are the same as the corresponding advantages for the third embodiment of the present invention. The remaining description of the sixth embodiment is the same as corresponding portions of the descriptions given for the third, fourth, and fifth embodiments of the present invention.

The next four embodiments of the present invention furnish determinations of a pair of datum lines in each of reflecting surfaces 51 and 61 and local angular rotations of the reflecting surfaces about the datum lines with high spatial resolution. The datum lines of a pair of datum lines lie in two x-y planes.

Each of a seventh, eighth, variant of the eighth, and ninth embodiments comprise the apparatus and methods of the fourth, the fifth, the variant of the fifth, and sixth, embodiments, respectively, and additional angular displacement interferometers. An eighth embodiment comprises the fifth embodiment and additional angular displacement interferometers. The additional angular displacement interferometers measure changes in local slopes in planes orthogonal to x-y planes along respective pairs of datum lines. The respective pairs of datum lines are determined by procedures the same as respective procedures of the fourth, the fifth, the variant of the fifth, and sixth embodiments of the present invention.

Figure 4:
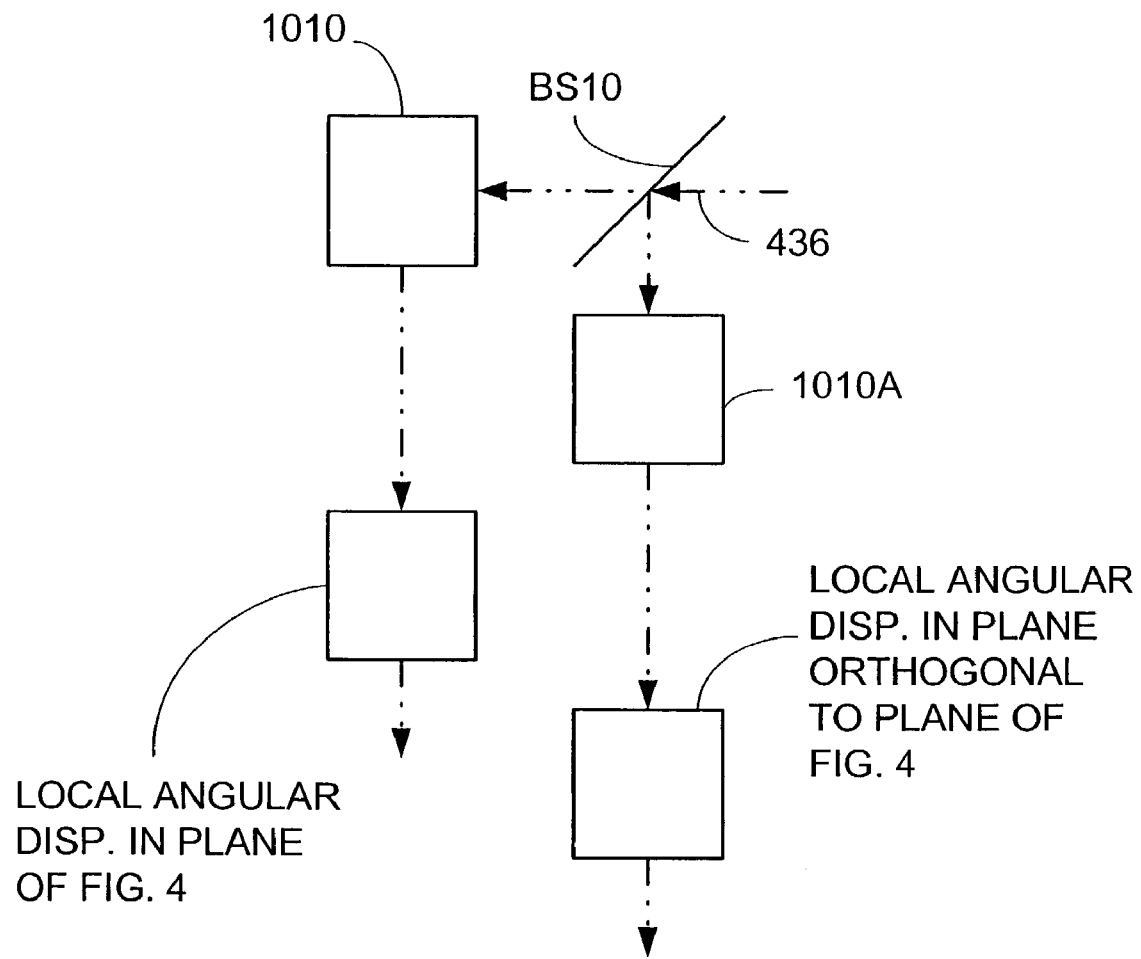
FIG. 4 is a diagrammatic view of interferometers arranged for measuring local angular displacements in orthogonal planes for use in yet further embodiments of the invention.

The additional angular displacement interferometers for the seventh, eighth, variant of the eighth, and ninth embodiments are the same as interferometers 1010 shown in FIG. 2b wherein the orientation of the additional interferometers is chosen so as to be sensitive to changes in directions of respective beams in planes orthogonal to the x-y plane, i.e. the z-axis direction. For example, to convert the fourth embodiment to the seventh embodiment, portions of beams 436 and 1436 are split off by a beam splitter BS10 and the portions directed to the additional angular displacement interferometer 1010A (see FIG. 4). Angular displacement interferometer 1010A is the same as interferometer 1010 in FIG. 3a except rotated 90 degrees so as to be sensitive to changes in directions of the split off portions in planes orthogonal to the x-y plane. The additional angular displacement interferometers for the eighth embodiment comprises interferometers that measure the average direction of a pair of beams and the difference in direction of the pair of beams.

Figure 5:
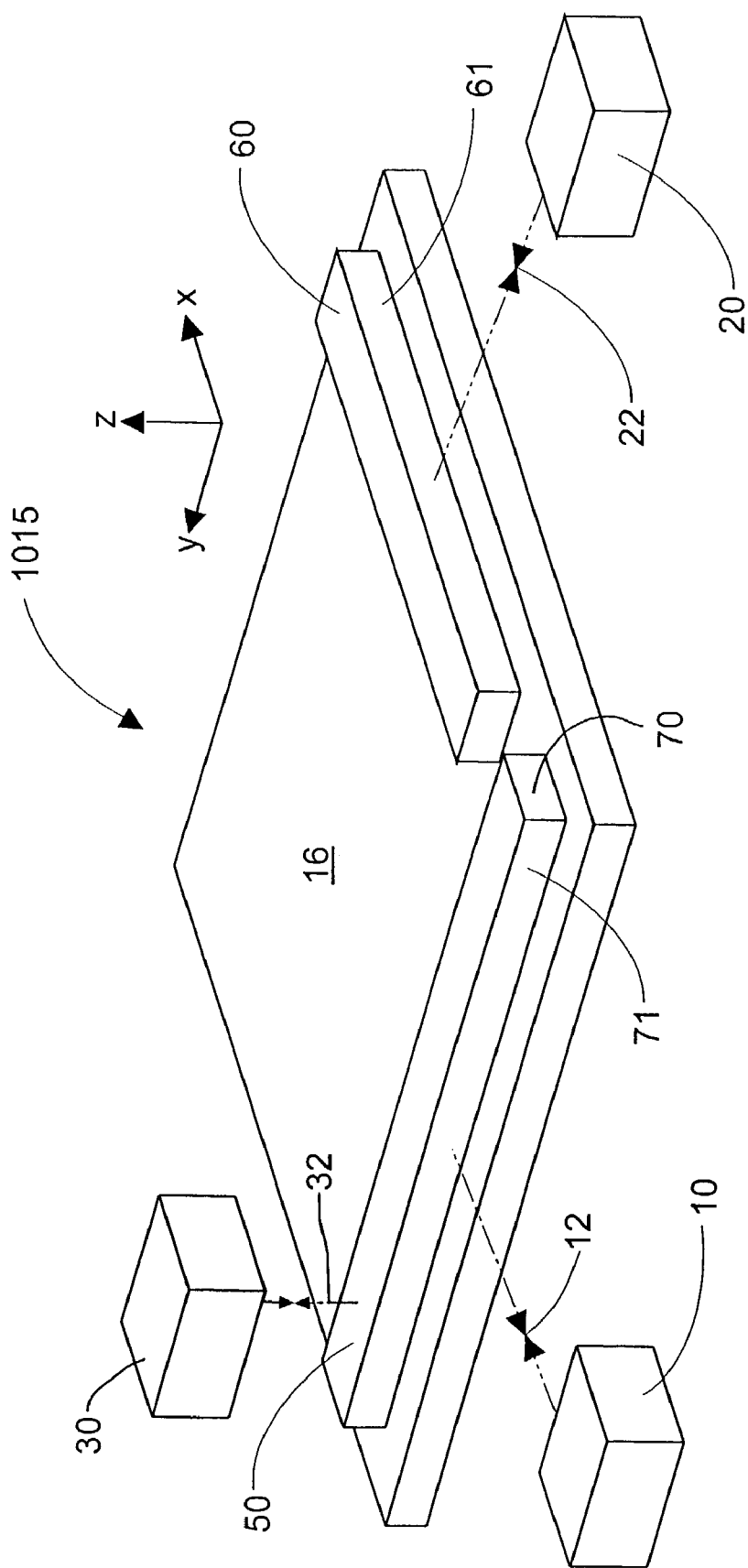
FIG. 5 is a diagrammatic perspective view of an interferometric system that employs three orthogonally arranged interferometers systems by which the shapes of an array of elongated object mirrors may be characterized in situ.

Reference is now made to FIG. 5 which is a diagrammatic perspective view of an interferometric system 1015 that employs three orthogonally arranged interferometers systems by which the shapes of an array of elongated object mirrors may be characterized in situ with high spatial resolution along multiple orthogonal datum lines. As shown in FIG. 5, system 1015 comprises a stage 16 that preferably forms part of a photolithographic apparatus for fabricating semiconductor products such as integrated circuits or chips. Affixed to the stage are thin high aspect ratio measurement objects comprising plane mirrors 70 and 60 elongated in the x- and y-directions. Mirror 60 has a x-z reflective surface 61 elongated in the x-direction and mirror 70 has elongated in the y-direction y-z reflective surface 71 and x-y reflective surface 72. The stage is translated along two orthogonal directions, x and y. There is substantially no scan in the z-direction.

Fixedly mounted off-stage is an interferometer (or interferometer subsystem) that is generally indicated, at 10. The purpose of interferometer 10 is the same as the purpose of interferometer 10 of FIG. 1 and generally is to measure the position in the x-direction and angular rotation of stage 16 about the y and/or z axes as stage 16 translates in the y-direction, and thus the position in the x-direction and angular rotation of reflecting surface 71 about the y and/or z axes as stage 16 translates in the y-direction. To accomplish this, interferometer 10 may be structured and arranged as one of a number of interferometric types including, but not limited to, the interferometer systems used for interferometer 10 of the first nine embodiments and variants thereof of the present invention. Interferometric beams of interferometer 12 travel to and from mirror 70 generally along an optical path designated as 12.

Another interferometer or interferometer subsystem fixedly mounted off-stage is generally indicated at 20. The purpose of interferometer 20 is the same as the purpose of interferometer 20 of FIG. 1 and generally is to measure the position in the y-direction and angular rotation of stage 16 about the x and/or z axes as stage 16 translates in the x-direction, and thus the position in the y-direction and angular rotation of reflecting surface 61 about the x and/or z axes as stage 16 translates in the x-direction. To accomplish this, interferometer 20 may be structured and arranged as one of a number of interferometric types including, but not limited to, the interferometer systems used for interferometer 20 of the first nine embodiments and variants thereof of the present invention. To achieve this, interferometer 20 directs and receives interferometric beams to and from mirror surface 61 along an optical path designated generally as 22.

A third interferometer or interferometer subsystem fixedly mounted off-stage is generally indicated at 30. The purpose of interferometer 30 generally is to measure the position in the z-direction and angular rotation of stage 16 about the x and/or y axes as stage 16 translates in the x- and y-directions, and thus the position in the z-direction and angular rotation of reflecting surface 61 about the x and/or y axes as stage 16 translates in the x- and y-directions. To achieve this, interferometer 30 directs and receives interferometric beams to and from mirror surface 72 along an optical path designated generally as 32.

To accomplish the purpose of interferometer 30, interferometer 30 may be structured and arranged as one of a number of interferometric types including, but not limited to, the interferometer systems used for interferometers 10 and 20 of the first nine embodiments and variants thereof of the present invention.

An example of a single pass interferometer that may be modified to measure the change in direction of propagation of a measurement beam for use as interferometer 30 is described in commonly owned U.S. patent application Ser. No. 09/853,114 filed May 10, 2001 and entitled "In-Situ Mirror Characterization" by Henry A. Hill, published on Nov. 1, 2001 as Publication No. US-2001-0035959-A1, the contents of which are incorporated in their entirety by reference.

Double pass interferometers that can be modified to measure changes in direction of propagation of a measurement beam for use as interferometer 30 are described for example in commonly owned U.S. patent application Ser. No. 09/852,898 filed May 10, 2001 and entitled "Interferometric Apparatus And Method(s) For Precision Measurement Of Altitude Above A Surface" by Henry A. Hill, published on Nov. 29, 2001 as Publication No. US-2001-0046053-A1, the contents of which are herein incorporated in their entirety by reference.

Interferometer 30 will generally comprise an elongated reference mirror affixed off stage such as described in cited U.S. patent application Ser. No. 09/853,114 published on Nov. 1, 2001 as Publication No. US-2001-0035959 and U.S. patent application Ser. No. 09/852,898 published on Nov. 29, 2001 as Publication No. US-2001-0046053-A1. Also mirror 71 may comprise elongated surfaces oriented at angles such as 45 degrees to a x-y plane.

Datum lines and rotations of local surfaces about the datum lines for reflecting surfaces 61 and 71 are determined by procedures such as described in the first nine embodiments and variant thereof of the present invention.

Datum lines in reflecting surfaces such as reflecting surface 71, the corresponding reference mirror(s) affixed off stage, and the reflecting surfaces located at angles such as 45 degrees and local rotations of the reflecting surfaces about the datum lines are determined by interferometer 30 as stage 16 is scanned in the x- and y-directions using information about stage orientation obtained from interferometers 10 and 20 and procedures described for the determination of the datum lines and rotations of local surfaces about the datum lines for reflecting surfaces 61 and 71.

Figure 6:
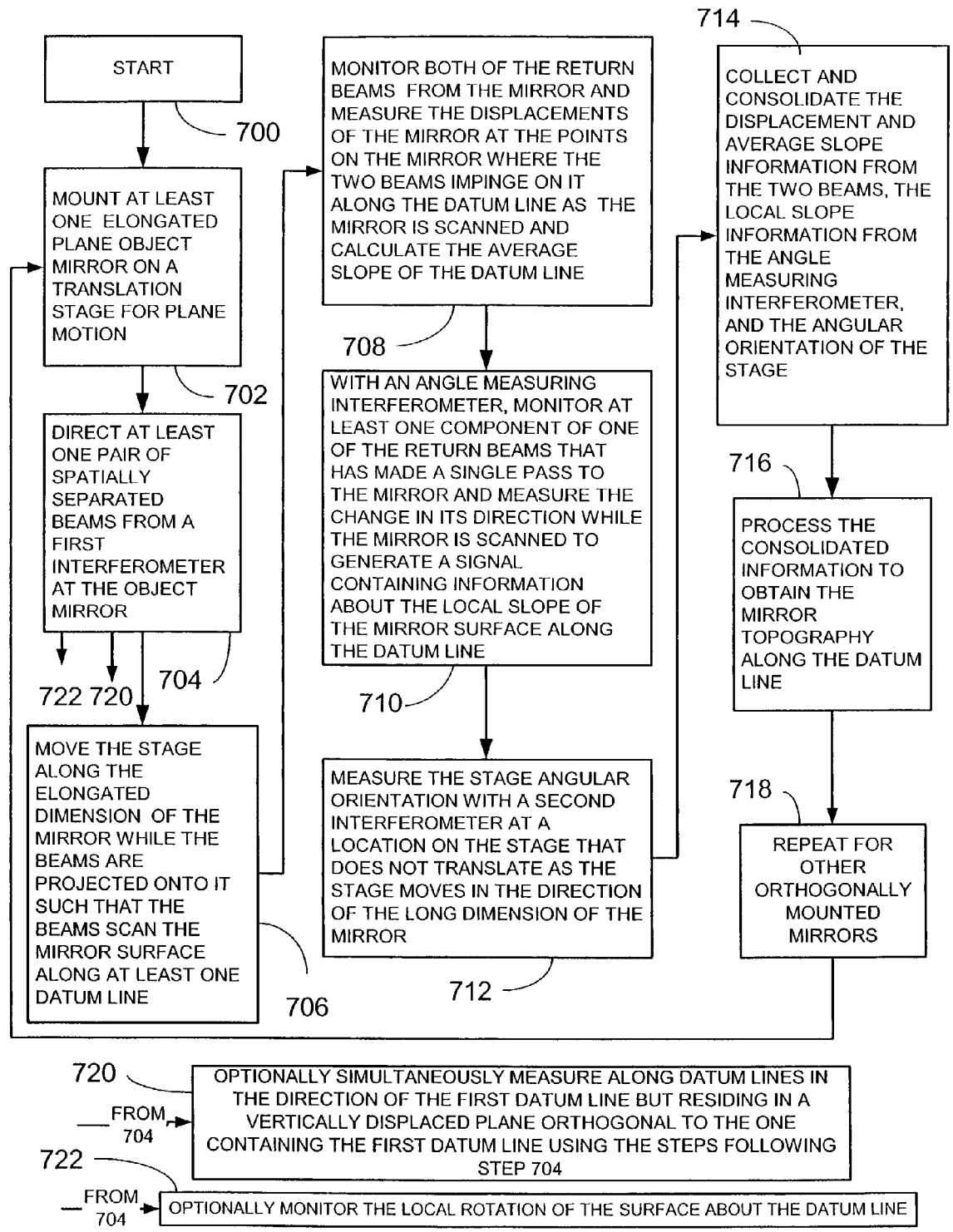
FIG. 6 is a flow chart of a general method for characterizing topographic features of a mirror in situ.

Having described a number embodiments of apparatus of the invention and their variants, reference is now made to the flow chart of FIG. 6 which illustrates a general methodology for characterizing topographic features of object mirrors in situ.

In block 700, the method is started followed by the step of block 702 where at least one elongated plane object mirror is mounted on a translation stage for plane motion. Alternatively, It should be noted that the start step 700 may be thought of as beginning after step 702 is preformed, and would begin in a familiar way as, for example, by an instruction from an operator via a computer work station.

In the step of block 704, at least one pair of spatially separated beams from a first interferometer is directed at the object mirror. Here, use may be made of more than one interferometer where any additional interferometers also direct pairs of spatially beams at the mirror but in planes that are offset with respect to one another in parallel or orthogonal planes as in block 720 which may optionally be started simultaneously with step 704 and subsequent steps.

In block 706, the stage is moved along the elongated dimension of the mirror while the beams are projected onto it such that the beams scan the mirror surface along at least one datum line. Note that if step 720 has been introduced, there will be at least one more datum line in a plane orthogonal to the one in which the other datum lines reside.

In block 708, both of the return beams from the mirror are monitored and the displacements of the mirror at the points on the mirror where the two beams impinge on it along the datum line are measured as the mirror is scanned and the average slope of the datum line is calculated.

In block 710, a component of at least one of return beams that has made only a single pass to the mirror is monitored with an angle measuring interferometer and the change in its direction is measured while the mirror is scanned to generate a signal containing information about the local slope of the mirror surface along the datum line.

In block 712, the stage angular orientation is measured with another orthogonally positioned second interferometer at a location on the stage that does not translate as the stage moves in the direction of the long dimension of the mirror.

In block 714, the displacement and average slope information from the two beams, the local slope information from the angle measuring interferometer, and the angular orientation of the stage is collected and consolidated.

In block 716, the consolidated information is processed to obtain the mirror topography along the one or more datum lines employed. The information is processed by suitable electronic processor and computers preferably using integral transforms of $<dx/dy>$ and $(dx/dy)_{local}$ previously described hereinabove. However, those skilled in the art will understand that other processing algorithms involving Fourier transforms, polynomial or other forms of orthogonal representations, and the like may be beneficially employed.

In block 718, the previous steps may be repeated as needed for orthogonally mounted mirrors.

In block 722, another interferometer may optionally be used to measure the rotation of the mirror surface about the datum line.

In implementing the foregoing method, it should be apparent that one or more of the interferometric apparatus described or referenced hereinabove may be used.

While specific embodiments and methods of the invention have been described, variants of these will be apparent to those skilled in the art based on the teaching of the invention. For example, it will be apparent that one or more of the various interferometer subsystems may be mounted on the translation stage for movement therewith while the corresponding mirrors are fixedly mounted with respect to the reference frame. It will also be apparent that the interferometer subsystems may be configured in a variety of stacked arrays to provide a plurality of Interferometric measurement beams that may be selectively operable to measure local slope along one or more datum lines offset in a direction orthogonal to the scan direction and then integrating, or otherwise mathematically treating, the local slope information generated to determine local mirror shape. It will also be apparent that the stage and elongated mirrors of the invention may be formed as monolithic structures, need not be mirrors of high aspect ratio, can be thick, and can be formed of refractive elements, such as prismatic optical elements that perform reflecting functions. Therefore, it is intended that all such variants fall within the scope of the appended claims.

The invention claimed is:

1. Interferometric apparatus comprising:
   a translation stage;
   an electro-mechanical arrangement for selectively translating said translation stage in at least one of at least two orthogonal directions;
   at least one mirror mounted in a predetermined manner with respect to said translation stage, said at least one mirror having a reflecting surface;
   interferometer means for generating a plurality of measurement beams adapted and arranged for projection onto said reflecting surface to measure the displacement of said translation stage in at least one direction and at least a local slope of said at least one mirror;
   control means having a mode of operation for selectively translating said translation stage, said at least one mirror and said interferometer means relative to one another in said mode of operation so that selected ones of said plurality of beams of said interferometer means scan said at least one mirror along at least one corresponding datum line to generate at least one signal comprising information indicative of the local slope of said reflecting surface along said at least one corresponding datum line in at least one plane with a surface normal orthogonal to the direction of scan; and
   signal and analysis means for extracting said information contained in said at least one signal and determining the local shape of said at least one mirror.

2. The interferometric apparatus of claim 1 wherein said at least one signal further includes information indicative of the position of said reflecting surface in said at least one plane as a function of scan position along said at least one datum line.

3. The interferometric apparatus of claim 1 wherein said at least one signal further includes information indicative of the average slope of said reflecting surface in said at least one plane as a function of scan position along said at least one datum line.

4. The interferometric apparatus of claim 1 wherein said at least one signal further includes information indicative of the position and average slope of said reflecting surface in said at least one plane as a function of scan position along said at least one datum line.

5. The interferometric apparatus of claim 1 wherein said plurality of beams comprise at least one pair of beams, each of predetermined diameter and spaced apart from one another by a predetermined distance along said scan direction.

6. The interferometric apparatus of claim 5 wherein said interferometer means comprises at least one angle measuring interferometer and wherein said at least one pair of beams is configured and arranged to provide information by which said average slope may be measured and at least a portion one of said beams of said at least one pair is received by said angle measuring interferometer after having made one pass to said mirror to measure the local slope thereof along said datum line in said plane.

7. The interferometric apparatus of claim 5 wherein said interferometer means comprises at least one angle measuring interferometer and wherein said at least one pair of beams is configured and arranged to provide information about the position of said reflecting surface at points corresponding to the projection of said beams onto said reflecting surface and at least a portion of one of said beams of said at least one pair is received by said angle measuring interferometer after having made one pass to said mirror to measure the local slope thereof along said datum line in said plane.

8. The interferometric apparatus of claim 1 wherein said interferometer means comprises one or more interferometers selected from the group consisting of high stability plane mirror interferometers, passive differential zero shear interferometers, active zero shear interferometers, and angle interferometers.

9. The interferometric apparatus of claim 1 wherein said signal and analysis means is structured to determine the local shape of said at least one mirror with the use of mathematical procedures selected from the group consisting of integral transforms, Fourier analysis, orthogonal function analysis, and polynomial expansions.

10. The interferometric apparatus of claim 1 wherein said at least one mirror is mounted to said translation stage for movement therewith and said at least one interferometer subsystem is fixedly mounted off said translation stage.

11. The interferometric apparatus of claim 1 wherein said at least one interferometer subsystem is fixedly mounted to said translation stage for movement therewith and said at least one mirror is fixedly mounted off said translation stage.

12. The interferometric apparatus of claim 1 wherein said control means is structured and arranged with another mode of operation in which the motion of said translation stage is measured in at least one direction with respect to a reference frame.

13. The interferometric apparatus of claim 1 wherein said plurality of beams comprise at least two pairs of beams, each pair comprising two beams of predetermined diameter and spaced apart from one another by a predetermined distance along said scan direction, each of said pair also being offset with respect to one another in a direction perpendicular to the scan direction.

14. The interferometric apparatus in claim 1 wherein said interferometric apparatus is configured and arranged to generate said plurality of beams such that preselected ones of said beams are orthogonally arranged with respect to one another to measure displacement of said translation stage in orthogonal directions and at least a local slope of at least one other mirror surface orthogonal to that of said at least one mirror.

15. The interferometric apparatus of claim 1 further including two or more orthogonally arranged mirrors and with corresponding interferometer means mounted for relative motion with respect to one another while said control means is in said mode of operation to measure the local shape of said mirrors.

16. The interferometric apparatus of claim 1 wherein at least one of said mirrors has a reflecting surface that is arranged at 45 degrees with respect to said translation stage.

17. The interferometric apparatus of claim 1 further including at least one photolithographic wafer mount located on said translation stage for movement therewith.

18. The interferometric apparatus of claim 17 further including a photolithographic exposure unit fixedly mounted to a reference frame for forming masked patterns on wafers located on said translation stage.

19. An Interferometric method comprising the steps of:
mounting at least one mirror in a predetermined manner with respect to a translation stage, said at least one mirror having a reflecting surface;
selectively translating said translation stage in at least one of at least two orthogonal directions;
generating a plurality of interferometric measurement beams adapted and arranged for projection onto said reflecting surface to measure the displacement of said translation stage in at least one direction and at least a local slope of said at least one mirror;
selectively translating said translation stage in a first mode of operation, said at least one mirror and said measurement beams relative to one another so that selected ones of said plurality of beams scan said at least one mirror along at least one corresponding datum line to generate at least one signal comprising information indicative of the local slope of said reflecting surface along said at least one corresponding datum line in at least one plane with a surface normal orthogonal to the direction of scan; and
analyzing said at least one signal to extract said information contained in said at least one signal and determining the local shape of said at least one mirror.

20. The interferometric method of claim 19 wherein said at least one signal further includes information indicative of the position of said reflecting surface in said at least one plane as a function of scan position along said at least one datum line.

21. The interferometric method of claim 19 wherein said at least one signal further contains information indicative of the average slope of said reflecting surface in said at least one plane as a function of scan position along said at least one datum line.

22. The interferometric step of claim 19 wherein said at least one signal further includes information indicative of the position and average slope of said reflecting surface in said at least one plane as a function of scan position along said at least one datum line.

23. The interferometric method of claim 19 wherein said plurality of beams comprise at least one pair of beams, each of predetermined diameter and spaced apart from one another by a predetermined distance along said scan direction.

24. The interferometric method of claim 23 wherein said at least one pair of beams is configured and arranged to provide information by which said average slope may be measured and at least a portion of one of said beams of said at least one pair is received by an angle measuring interferometer after having made one pass to said mirror to measure the local slope thereof along said datum line in said plane.

25. The interferometric method of claim 23 wherein said at least one pair of beams is configured and arranged to provide information about the position of said reflecting surface at points corresponding to the projection of said beams onto said reflecting surface and at least a portion of one of said beams of said at least one pair is received by an angle measuring interferometer after having made one pass to said mirror to measure the local slope thereof along said datum line in said plane.

26. The interferometric method of claim 19 wherein said plurality of beams is provided by interferometer means comprising one or more interferometers selected from the group consisting of high stability plane mirror interferometers, passive differential zero shear interferometers, active zero shear interferometers, and angle interferometers.

27. The interferometric method of claim 19 wherein said step of analysis determines the local shape of said at least one mirror with the use of mathematical procedures selected from the group consisting of integral transforms, Fourier analysis, orthogonal function analysis, and polynomial expansions.

28. The interferometric method of claim 19 further including another mode of operation in which the motion of said translation stage is measured in at least one direction with respect to a reference frame.

29. The interferometric method of claim 19 wherein said plurality of beams comprise at least two pairs of beams, each pair comprising two beams of predetermined diameter and spaced apart from one another by a predetermined distance along said scan direction, each of said pair also being offset with respect to one another in a direction perpendicular to the scan direction.

30. The interferometric method in claim 19 wherein said plurality of beams are configured and arranged such that preselected ones of said beams are orthogonally arranged with respect to one another to measure displacement of said translation stage in orthogonal directions and at least a local slope of at least one other mirror surface orthogonal to that of said at least one mirror.

31. The interferometric method of claim 19 further including mounting two or more orthogonally arranged mirrors on said translation stage for relative motion with respect to corresponding ones of said plurality of beams while in said first mode of operation to measure the local shape of said mirrors.

32. The interferometric method of claim 31 wherein at least one of said mirrors includes a reflecting surface that is mounted at 45 degrees with respect to said translation stage.

33. The interferometric method of claim 19 further including the step of mounting at least one photolithographic wafer on said translation stage for movement therewith.

34. The interferometric apparatus of claim 33 further including the step of exposing a wafer at least once while located on said translation stage to form masked patterns on said wafer.

* * * * *